(12) United States Patent
Kang et al.

(10) Patent No.: US 11,903,266 B2
(45) Date of Patent: Feb. 13, 2024

(54) DISPLAY APPARATUS INCLUDING A THIN-FILM TRANSISTOR INCLUDING A SILICON SEMICONDUCTOR AND A THIN-FILM TRANSISTOR INCLUDING AN OXIDE SEMICONDUCTOR

(71) Applicant: SAMSUNG DISPLAY CO., LTD., Yongin-si (KR)

(72) Inventors: Jangmi Kang, Yongin-si (KR); Dongwoo Kim, Yongin-si (KR); Cheolgon Lee, Yongin-si (KR); Jaeyong Jang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/095,076

(22) Filed: Jan. 10, 2023

(65) Prior Publication Data

US 2023/0146196 A1 May 11, 2023

Related U.S. Application Data

(62) Division of application No. 16/907,793, filed on Jun. 22, 2020, now Pat. No. 11,574,972.

(30) Foreign Application Priority Data

Sep. 5, 2019 (KR) .......................... 10-2019-0110194

(51) Int. Cl.
*H10K 59/124* (2023.01)
*H10K 59/131* (2023.01)
*H01L 29/786* (2006.01)

(52) U.S. Cl.
CPC ....... *H10K 59/124* (2023.02); *H01L 29/7869* (2013.01); *H01L 29/78651* (2013.01); *H10K 59/131* (2023.02)

(58) Field of Classification Search
CPC ................ H10K 59/124; H10K 59/131; H01L 29/78651; H01L 29/7869
See application file for complete search history.

(56) References Cited

U.S. PATENT DOCUMENTS 8,558,239 B2  10/2013  Lee et al.
9,257,493 B2  2/2016  Lee et al.
(Continued)

FOREIGN PATENT DOCUMENTS

KR  10-2014-0077002  6/2014
KR  10-2017-0106621  9/2017
(Continued)

*Primary Examiner* — Benjamin Tzu-Hung Liu
(74) *Attorney, Agent, or Firm* — F. Chau & Associates, LLC

(57) ABSTRACT

A display apparatus is provided including a display area and a non-display area. The display area includes a display element and the non-display area includes a pad portion. A first thin-film transistor (TFT) is arranged in the display area. The first TFT includes silicon and a first gate electrode. A second TFT is arranged on a first insulating layer covering the first gate electrode and includes an oxide and a second gate electrode. A first voltage line extends in a first direction. A data line is spaced apart from the first voltage line. A connection wire is disposed in the display area and connects the data line to the pad portion. The connection wire includes a first portion extending in the first direction and a second portion extending in a second direction crossing the first direction, and the first portion overlaps the first voltage line.

4 Claims, 14 Drawing Sheets

(56) References Cited

U.S. PATENT DOCUMENTS

| | | |
|---|---|---|
| 10,411,083 B2 | 9/2019 | Song et al. |
| 10,614,740 B2 * | 4/2020 | Lee .................... H10K 59/1213 |
| 2012/0013817 A1 * | 1/2012 | Kim ....................... G02F 1/1393 |
| | | 349/41 |
| 2018/0074361 A1 | 3/2018 | Chung et al. |
| 2019/0235682 A1 | 8/2019 | Choi et al. |
| 2021/0074783 A1 | 3/2021 | Kang et al. |
| 2021/0098494 A1 * | 4/2021 | Feng .................... H01L 27/124 |

FOREIGN PATENT DOCUMENTS

| | | |
|---|---|---|
| KR | 10-2018-0030325 | 3/2018 |
| KR | 10-2019-0038718 | 4/2019 |
| KR | 10-2020-0010697 | 1/2020 |

* cited by examiner

DISPLAY APPARATUS INCLUDING A THIN-FILM TRANSISTOR INCLUDING A SILICON SEMICONDUCTOR AND A THIN-FILM TRANSISTOR INCLUDING AN OXIDE SEMICONDUCTOR

CROSS-REFERENCE TO RELATED APPLICATIONS

This application is a divisional of U.S. patent application Ser. No. 16/907,793 filed on Jun. 22, 2020, which claims priority under 35 U.S.C. § 119 to Korean Patent Application No. 10-2019-0110194, filed on Sep. 5, 2019, in the Korean Intellectual Property Office, the disclosures of which are incorporated by reference herein in their entireties.

TECHNICAL FIELD

The present invention relates to a display apparatus and, more particularly, to a display apparatus including a thin-film transistor including a silicon semiconductor and a thin-film transistor including an oxide semiconductor.

DISCUSSION OF RELATED ART

A display device is an output device for presentation of information in visual form. In general, a display apparatus includes a display element and a driving circuit for controlling an electrical signal applied to the display element. The driving circuit may include a thin-film transistor (TFT), a storage capacitor, and a plurality of wires.

To precisely control light emission from the display element and a degree of light emission thereof, the number of TFTs electrically connected to one display element has increased. Thus, techniques for reducing power consumption of a highly integrated display apparatus are being actively conducted.

In addition, the display apparatus includes a display area for displaying an image and a non-display area that is on the periphery of the display area. Recently, the non-display area has been reduced so that the size of the display area can be increased.

SUMMARY

According to an exemplary embodiment of the present invention, a display apparatus is provided including a display area and a non-display area. The display area includes a display element and the non-display area includes a pad portion. A first thin-film transistor (TFT) is arranged in the display area. The first TFT includes silicon and a first gate electrode. A first insulating layer covers the first gate electrode. A second TFT is arranged on the first insulating layer and includes an oxide and a second gate electrode. A second insulating layer covers the second gate electrode. A first voltage line extends in a first direction on the second insulating layer. A data line is spaced apart from the first voltage line. A connection wire is disposed in the display area and connects the data line to the pad portion. The connection wire includes a first portion extending in the first direction and a second portion extending in a second direction crossing the first direction, and the first portion overlaps the first voltage line.

According to an exemplary embodiment of the present invention, the display element includes a pixel electrode and an opposite electrode and is arranged on the connection wire. The pixel electrode overlaps the first portion.

According to an exemplary embodiment of the present invention, a second voltage line overlaps the second portion and extends in the second direction.

According to an exemplary embodiment of the present invention, the second voltage line is arranged on the first insulating layer.

According to an exemplary embodiment of the present invention, the display apparatus further includes a scan line overlapping the second portion and extending in the second direction.

According to an exemplary embodiment of the present invention, the first portion includes a first protrusion protruding in the second direction and overlapping the second voltage line.

According to an exemplary embodiment of the present invention, the display apparatus further includes a node connection line arranged on the second insulating layer and connected to the first gate electrode through a contact hole. A first planarizing layer covers the node connection line. A shielding electrode overlaps the node connection line and is connected to the second voltage line.

According to an exemplary embodiment of the present invention, the connection wire is arranged on the same layer as the shielding electrode.

According to an exemplary embodiment of the present invention, the second thin-film transistor further includes a third gate electrode arranged under the second semiconductor layer to overlap the second semiconductor layer.

According to an exemplary embodiment of the present invention, the second voltage line is arranged on the same layer as the third gate electrode.

According to an exemplary embodiment of the present invention, the second portion includes a second protrusion protruding in the first direction and overlapping the first voltage line.

According to an exemplary embodiment of the present invention, the display apparatus further includes a first planarizing layer between the first voltage line and the connection wire.

According to an exemplary embodiment of the present invention, the display apparatus further includes a first planarizing layer between the second gate electrode and the first voltage line. A second planarizing is disposed layer between the first voltage line and the connection wire.

According to an exemplary embodiment of the present invention, the display apparatus further includes a boost capacitor comprising a lower electrode arranged on the same layer as the first gate electrode and an upper electrode arranged on the same layer as the second semiconductor layer.

According to an exemplary embodiment of the present invention, the connection wire includes a third portion extending in the first direction and connected to the pad portion. The data line is connected to the first portion in the non-display area.

According to an exemplary embodiment of the present invention, a display apparatus is provided including a substrate. The substrate includes a display area and a non-display area. The non-display area includes a pad portion outside the display area. A first thin-film transistor is arranged in the display area, and includes a first semiconductor layer including a silicon semiconductor and a first gate electrode insulated from the first semiconductor layer. A first insulating layer covers the first gate electrode. A second thin-film transistor is arranged on the first insulating layer, and includes a second semiconductor layer including an oxide semiconductor and a second gate electrode insulated from the second semiconductor layer. A second insulating layer covers the second gate electrode. A first voltage line is arranged on the second insulating layer and extends in a first direction. A first wire extends in the first direction adjacent to the first voltage line. A first signal line extends in a second direction crossing the first wire, wherein the first signal line is arranged on the same layer as the first gate electrode. A second wire overlaps the first signal line and extends in the second direction. The first wire is connected to the second wire through a contact hole in the display area.

According to an exemplary embodiment of the present invention, the second wire is arranged between the first insulating layer and the second insulating layer.

According to an exemplary embodiment of the present invention, the display apparatus further includes a first connection electrode arranged on the first insulating layer and a second connection electrode connected to the first connection electrode through a first contact hole and arranged on the second insulating layer. The first gate electrode is connected to the first connection electrode through a second contact hole. The second connection electrode is connected to the second semiconductor layer through a third contact hole.

According to an exemplary embodiment of the present invention, the display apparatus further includes a data line extending in the first direction. The data line is connected to the pad portion through the first wire and the second wire.

According to an exemplary embodiment of the present invention, a display apparatus is provided including a substrate. The substrate includes a display area including a display element and a non-display area including a pad portion outside the display area. A first thin-film transistor is arranged in the display area, and includes a first semiconductor layer including a silicon semiconductor or an oxide semiconductor and a first gate electrode insulated from the first semiconductor layer. A first voltage line extends in a first direction on the substrate. A second voltage line extends in a second direction on the substrate. A bent connection wire is disposed in the display area, the bent connection wire connects a data line to the pad portion. The bent connection wire includes a portion extending in the first direction. The portion of the bent connection wire overlaps the first voltage line, and the portion of the bent connection wire includes a first protrusion protruding in the second direction and overlaps the second voltage line.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENTS

A display apparatus as described herein is an apparatus for displaying an image and may include a liquid crystal display, an electrophoretic display, an organic light-emitting display, an inorganic electroluminescent (EL) display, a field emission display, a surface-conduction electron-emitter display, a quantum dot display, a plasma display, or a cathode ray display. Although an organic light-emitting display apparatus is described as an example of the display apparatus, in the following description, the present invention may be applied to various types of display apparatuses.

Figure 1:
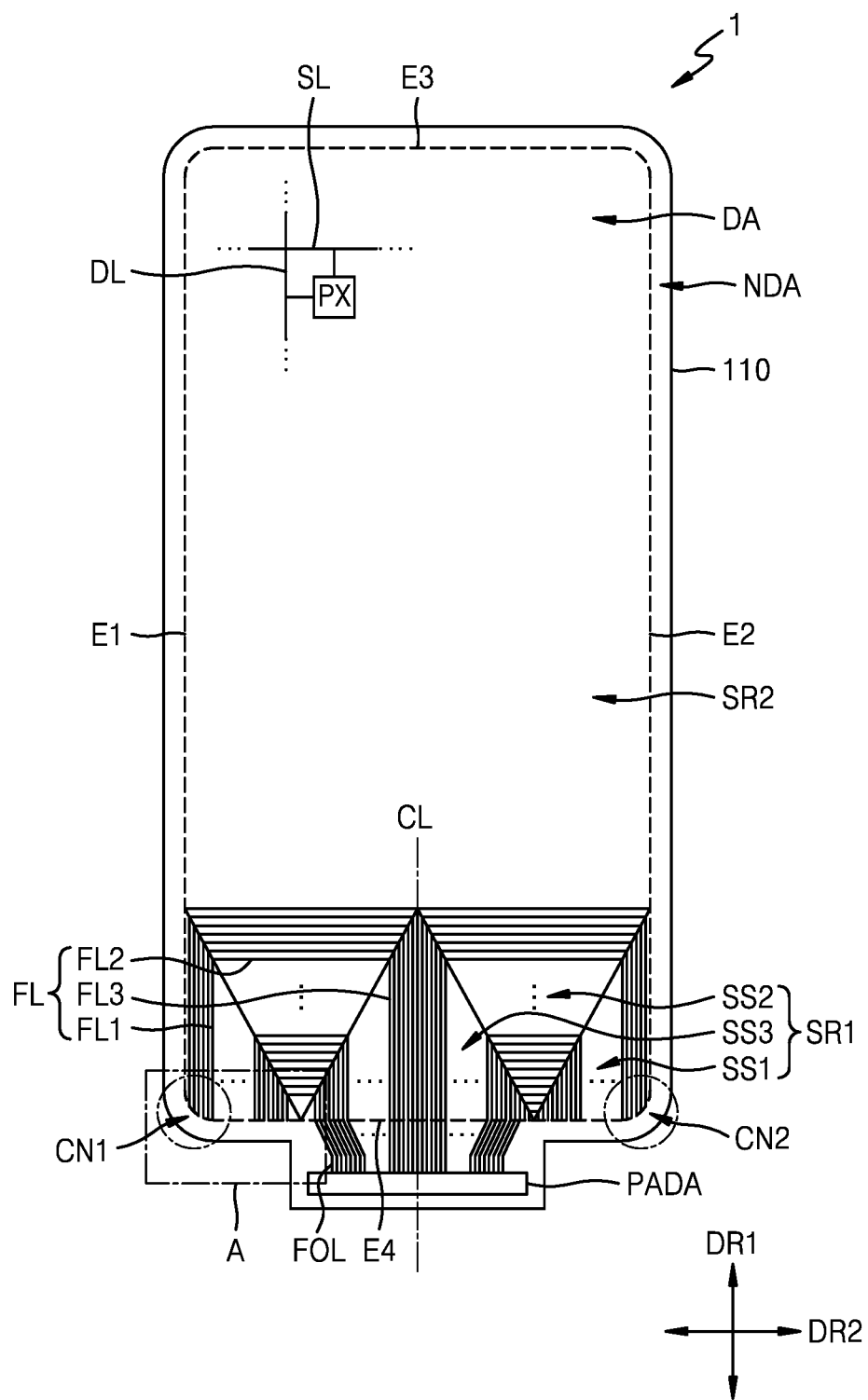
FIG. 1 is a schematic plan view of an example of a display apparatus according to an exemplary embodiment of the present invention.
Figure 2:
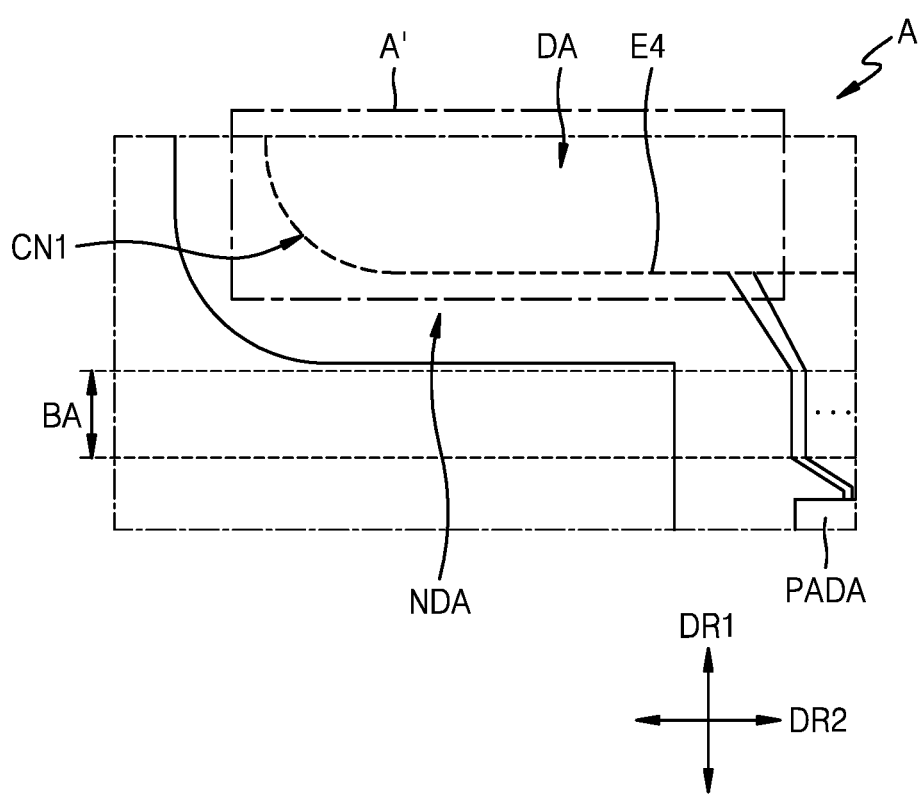
FIG. 2 is an enlarged schematic plan view of an area A of FIG. 1 according to an exemplary embodiment of the present invention.
Figure 3:
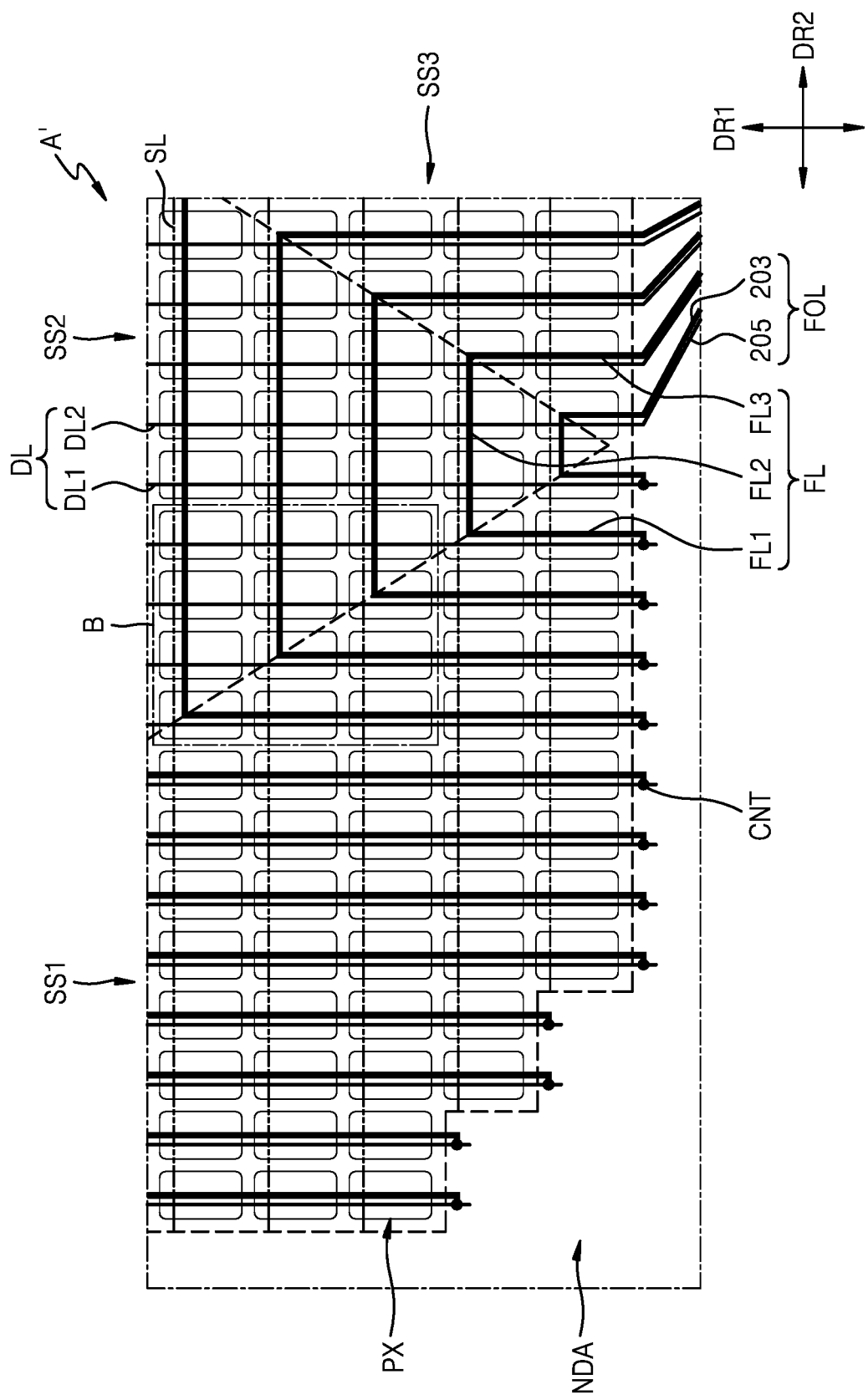
FIG. 3 is a partially enlarged plan view of an area A' of FIG. 2 according to an exemplary embodiment of the present invention.

FIG. 1 is a schematic plan view of an example of a display apparatus 1 according to an exemplary embodiment of the present invention. FIG. 2 is an enlarged schematic plan view of an area A of FIG. 1, and FIG. 3 is a partially enlarged plan view of an area A of FIG. 2.

Referring to FIG. 1, a substrate 110 of the display apparatus 1 may include a display area DA in which a pixel PX including a display element is arranged and a non-display area. NDA including a pad portion PADA disposed outside the display area DA. For example, a first side of the display apparatus 1 extending in a second direction (e.g., a DR2 direction) may include a protruding portion of the non-display area NDA extending in a first direction (e.g., the DR1 direction) which includes the pad portion PADA disposed thereon.

Edges of the display area DA may have a shape similar to a rectangle or a square. However, the present invention is not limited thereto. In the display area DA, a first corner CN1 at the edge thereof may have a round shape. For example, the display area DA may include a first edge E1 and a second edge E2 which face each other (e.g., are disposed extending in parallel in the first direction (e.g., the DR1 direction)), and a third edge E3 and a fourth edge E4 which are positioned between the first edge E1 and the second edge E2 and face each other (e.g., are disposed extending in parallel in the second direction (e.g., the DR2 direction)). The pad portion PADA is adjacent to the fourth edge E4 among the first edge E1 to the fourth edge E4. The first corner CN1 having a round shape connects the first edge E1 and the fourth edge E4. In the display area DA, a second corner CN2 at the edge thereof, in addition to the first corner CN1, may also have a round shape. The second corner CN2 connects the second edge E2 and the fourth edge E4. In addition, in the display area DA, portions other than the edge may have a round shape.

Each pixel PX emits, for example, red, green, blue, or white light, and may include, for example, an organic light-emitting diode (OLED). In addition, each pixel PX may further include devices such as a thin-film transistor (TFT) and a storage capacitor.

According to an exemplary embodiment of the present invention, the pixel PX may indicate a sub-pixel that emits red, green, blue, or white light.

Signal lines that may apply an electrical signal to the plurality of pixels PX may include a plurality of scan lines SL, a plurality of data lines DL, or the like. Each of the plurality of data lines DL may extend in the first direction (e.g., the DR1 direction), and each of the plurality of scan lines SL may extend in the second direction (e.g., the DR2 direction). The plurality of scan lines SL may be arranged, for example, in a plurality of rows to transmit scan signals to the pixels PX, and the plurality of data lines DL may be arranged, for example, in a plurality of columns to transmit data signals to the pixels PX. Each of the plurality of pixels PX may be connected to at least one corresponding scan line SL among the plurality of scan lines SL and a corresponding data line DL among the plurality of data lines DL.

A connection wire FL may connect signal lines in the display area DA to the pad portion PADA of the non-display area NDA. The connection wire FL may be connected to a fan-out wire FOL of the non-display area NDA, and the fan-out wire FOL may be connected to the pad portion PADA. For example, a first end of the fan-out wire FOL may be connected to the pad portion PADA and a second end of the fan-out wire may be connected to the connection wire FL.

The connection wires FL may be arranged in the display area DA.

In an exemplary embodiment of the present invention, a virtual center line CL may bisect the display apparatus 1. For example, the virtual center line CL may extend in the first direction (e.g., the DR1 direction). The connection wires FL arranged on the left side of the virtual center line CL of the display area DA and connection wires FL arranged on the right side of the virtual center line CL of the display area DA may be approximately symmetrical with respect to the virtual center line CL.

Each of the connection wires FL may include a first portion FL1 and a third portion FL3 extending in the first direction (e.g., the DR1 direction), and a second portion FL2 extending in the second direction (e.g., the DR2 direction). The second portion FL2 may connect the first portion FL1 and the third portion FL3. The first portion FL1, the second portion FL2, and the third portion FL3 may be integrally formed. The third portion FL3 may be arranged at or adjacent to the virtual center line CL, and the first portion FL1 may be arranged at the corners CN1 and CN2. The first portion FL1 may extend in the first direction (e.g., the DR1 direction) away from the fourth edge E4. The second portion FL2 may be bent from the first portion FL1 and extend in the second direction (e.g., the DR2 direction) from the first edge E1 or the second edge E2 toward the virtual center line CL. The third portion FL3 may extend in the first direction (e.g., the DR1 direction) to the fourth edge E4 facing the pad portion PADA from the pad portion PADA. A collective shape of the connection wires FL about each side of the virtual center line CL may be an upside-down rectilinear U-shape. The downturned sides of each upside-down rectilinear U-shape may contact a boundary of the fourth edge E4. For example, the connection wires FL comprising the collective structure may have a nesting U-shape, each with parallel sides to an adjacent connection wire FL and featuring different heights and widths.

The display area DA may be divided into a plurality of areas depending on where the connection wires FL are arranged. For example, the display area DA may include a first area SR1 in which the connection wires FL are arranged and a second area SR2 that is the remaining area excluding the first area SR1. The second area SR2 may be an area where the connection wires FL are not positioned.

The first area SR1 may be divided into a plurality of sub-areas according to the extending direction of the connection wires FL. For example, the first area SR1 may include a first sub-area SS1 in which the first portions FL1 of the connection wires FL are arranged, a second sub-area SS2 in which the second portions FL2 are arranged, and a third sub-area SS3 in which the third portions FL3 are arranged. A first sub-area SS1, a second sub-area SS2, and a third sub-area SS3 positioned on the right side of the center line CL may be substantially symmetrical with a first sub-area SS1, a second sub-area SS2, and a third sub-area SS3 positioned on the left side of the center line CL, respectively.

The non-display area NDA may at least partially surround the display area DA. The non-display area NDA is an area where the pixels PX are not arranged and may include a pad portion PADA that is an area in which various electronic devices, printed circuit boards, or the like are electrically attached, and voltage lines for supplying power to drive display elements may be positioned therein. The pad portion PADA may include a plurality of pads, and the plurality of pads may be electrically connected to a data driver. In an exemplary embodiment of the present invention, a data driver for supplying a data signal may be arranged on a film electrically connected to pads of the pad portion PADA by using a chip on film (COF) method. According to an exemplary embodiment of the present invention, the data driver may be directly arranged on the substrate 110 by using a chip on glass (COG) or chip on plastic (COP) method.

The fan-out wires FOL may be arranged in the non-display area NDA. The fan-out wires FOL may be connected to the signal lines of the display area DA to transmit signals from the pad portion PADA. In an exemplary embodiment of the present invention, at least some of the fan-out wires FOL may be connected to the connection wires FL.

FIG. 1 is a plan view of the substrate 110 that is not bent. In an electronic device, such as a final display apparatus or a smartphone including a display apparatus, a part of the substrate 110 may be bent in order to minimize an area of the non-display area NDA recognized by a user.

Referring to FIG. 2, the non-display area NDA may include a bending area BA, and the bending area BA may be positioned between the pad portion PADA and the display area DA. In this case, the substrate 110 may be bent in the bending area BA such that at least a part of the pad portion PADA may be positioned to overlap the display area DA. The pad portion PADA does not cover the display area DA, and a bending direction is set such that the pad portion PADA is positioned behind the display area DA. Accordingly, the user may recognize that the display area DA occupies most of the display apparatus's viewing surface.

FIG. 3 illustrates a part of the first corner CN1. According to the present exemplary embodiment of the present invention, the display apparatus 1 or an electronic device including the same is recognized as having a round shape, in other words, a curved line shape when observed by the user in a normal usage environment. In other words, a generalized shape of the first corner CN1 from a user's vantage may appear as a round shape. However, in an environment where wires having a width of several micrometers or several tens of micrometers are observable by enlarging the first corner CN1, as illustrated in FIG. 3, the first corner CN1 may appear to have a straight line shape that is bent several times in the first direction (e.g., the DR1 direction) and the second direction (e.g., the DR2 direction). For example, the first corner CN1 may have stepped shape with sequential steps spaced apart in the first direction (e.g., the DR1 direction) and an extension length extending in the second direction (e.g., the DR2 direction). A lowermost step adjacent to the pad portion PADA may have a shortest width among the steps of the stepped shape (e.g., a minimum extension length extending in the second direction (e.g., the DR2 direction). Although the first corner CN1 appears to have a straight line shape that is bent several times by enlarging the first corner CN1, as illustrated in FIG. 3, the first corner CN1 may be recognized to have a round shape, in other words, a curved line shape in a normal usage environment. Thus, when the first corner CN1 and the second corner CN2 have a round shape, this may include both a case where the shape is substantially round and a case where the shape is a straight line that is bent several times.

Referring to FIG. 3, the data lines DL may include first data lines DL1 and second data lines DL2. The first data lines DL1 may be data lines connected to the connection wires FL by a node indicated by a circle. The second data lines DL2 may be data lines other than the first data lines DL1.

Also, the fan-out wire FOL may include first fan-out wires 203 and second fan-out wires 205. The first fan-out wires 203 may be fan-out wires connected to the connection wires FL. The second fan-out wires 205 may be fan-out wires other than the first fan-out wires 203. For example, the second fan-out wires 205 of the fan-out wire FOL may connect to the second data lines DL2.

In the display area DA, the connection wires FL may be arranged to transmit electrical signals supplied from the pad portion PADA to signal lines connected to the pixels PX. For example, the connection wires FL may be connected to the second data lines DL2 and be configured to transmit data signals supplied from the pads of the pad portion PADA to the second data lines DL2. Each of the connection wires FL may be positioned on a layer different from layers on which scan lines SL and data lines of the pixel PX are arranged. However, the present invention is not limited thereto.

A first portion FL1 of each of the connection wires FL may be parallel to a first data line DL1, and may be arranged to partially overlap or be adjacent to the first data line DL1. The first portion FL1 of each of the connection wires FL may extend in parallel with a first data line DL1 arranged in one of a plurality of columns. A second portion FL2 of each of the connection wires FL may be parallel to the scan line SL, and may be arranged to partially overlap or be adjacent to the scan line SL. The second portion FL2 of each of the connection wires FL may extend in parallel with a scan line SL arranged in one row of a plurality of rows. A third portion FL3 of each of the connection wires FL may be parallel to the first data line DL1 and/or the second data line DL2, and may be arranged to partially overlap or be adjacent to the second data line DL2. The third portion FL3 of each of the connection wires FL may extend in parallel with the first data line DL1 arranged in one of the plurality of columns.

The column in which the first portion FL1 of each of the connection wires FL is arranged and the column in which the third portion FL3 is arranged may be spaced at least one column apart. First portions FL1 of a pair of adjacent connection wires FL may be spaced at least one column apart. Third portions FL3 of the pair of adjacent connection wires FL may be spaced at least one column apart. Second portions FL2 of the pair of adjacent connection wires FL may be spaced at least one row apart.

One end of each of the connection wires FL may be connected to the first data line DL1 (e.g., at a first downturned side), and the other end (e.g., a second downturned side) thereof may be connected to a first fan-out wire 203. One end (e.g., a first end) of the first fan-out wire 203 may be connected to the other end (e.g., the second downturned side) of the connection wire FL, and the other end (e.g., a second side) of the first fan-out wire 203 may be connected to the pad of the pad portion PADA. In addition, the first portion FL1 of the connection wire FL may be electrically connected to the first data line DL1 at a contact portion CNT of the non-display area NDA. In an exemplary embodiment of the present invention, the first fan-out wire 203 may be a portion where the third portion FL3 extends to the non-display area NDA. In an exemplary embodiment of the present invention, the first fan-out wire 203 is a separate wire arranged on a layer different from the layer on which the connection wire FL (e.g., the first portion FL1) is arranged, and may be electrically connected to the third portion FL3 of the connection wire FL in the non-display area NDA.

One end (e.g., a first end) of a second fan-out wire 205 may be connected to a second data line DL2, and the other end (e.g., a second end) thereof may be connected to the pad of the pad portion PADA. In an exemplary embodiment of the present invention, the second fan-out wire 205 may be a portion where a second data line DL2 extends to the non-display area NDA. In an exemplary embodiment of the present invention, the second fan-out wire 205 is a separate wire arranged on a layer different from the layer on which the second data line DL2 is arranged, and may be electrically connected to the second data line DL2 in the non-display area NDA.

Arranging the connection wires FL in the display area DA as described above may reduce the area of the non-display area NDA surrounding the first corner CN1 or the second corner CN2. When the connection wires FL are not arranged in the display area DA as described above, the signal lines of the display area DA may extend in the direction of the first corner CN1 or the second corner CN2 in the display area DA to be connected to the fan-out wire FOLs. In this case, the area occupied by the fan-out wires FOL may be increased and the area of the non-display area NDA may be increased. In the present exemplary embodiment of the present invention, as the connection wire FL connected to the signal line passes through the display area DA, the area of the fan-out wire FOL may be minimized. Thus, the area of the non-display area NDA may be reduced.

Figure 4:
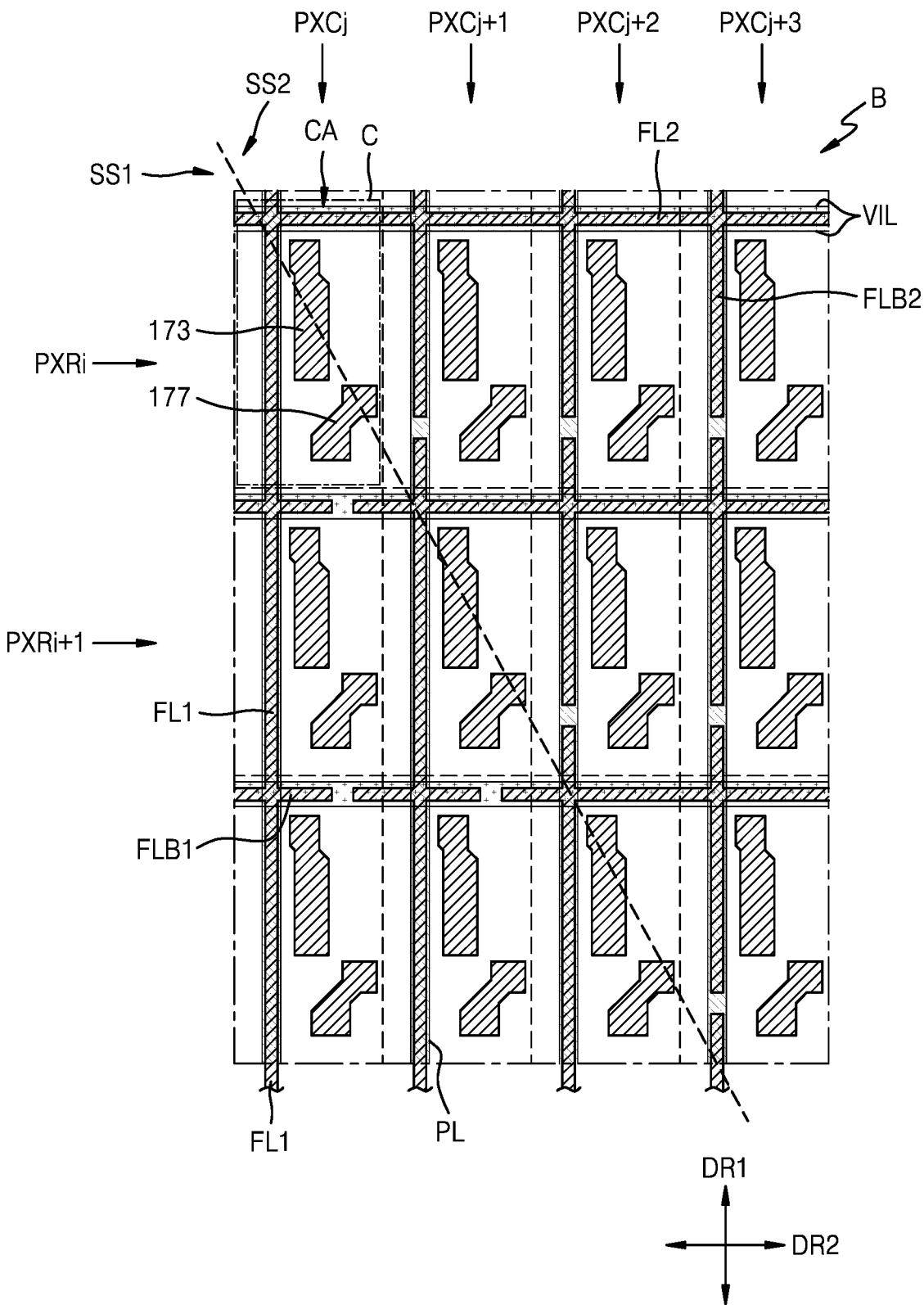
FIG. 4 is a partially enlarged plan view of an area B of FIG. 3 according to an exemplary embodiment of the present invention.

FIG. 4 is a plan view of the area B of FIG. 3 by partially enlarging the same. In FIG. 4, the same reference numerals as those in FIG. 3 refer to the same members, and redundant descriptions thereof will be omitted.

FIG. 4 exemplarily illustrates the connection wires arranged on the left side of the center line CL, which may be equally applied to the connection wires arranged on the right side of the center line CL. In FIG. 4, a pixel area CA where the pixels are arranged is divided by a dotted line FIG. 4 illustrates connection wires arranged in pixel areas CA of adjacent first and second rows PXRi and PXRi+1 and adjacent first to fourth columns PXCj, PXCj+1, PXCj+2 and PXCj+3.

FIG. 4 illustrates first portions FL1 and second portions FL2 of the connection wires arranged in the first sub-area SS1 and the second sub-area SS2, respectively, which may also be applied symmetrically to second portions FL2 and third portions FL3 of the connection wires arranged in the second sub-area SS2 and the third sub-area SS3.

Referring to FIG. 4, in the first sub-area SS1, the first portions FL1 of the connection wires may extend in the first direction (e.g., the DR1 direction).

In an exemplary embodiment of the present invention, as shown in FIG. 4, the first portion FL1 may overlap a driving voltage line PL. However, the present invention is not limited thereto. For example, in an exemplary embodiment of the present invention, the first portion FL1 may be spaced apart from the driving voltage line PL. Each driving voltage line PL may extend in the first direction e.g., the DR1 direction) and may be spaced at least one column apart. In an exemplary embodiment of the present invention, the width of the driving voltage line PL may be greater than the width of the first portion FL1, and the driving voltage line PL may have a width that completely covers the width of the first portion FL1.

The first portion FL1 may include first protrusions FLB1 protruding in the second direction (e.g., the DR2 direction) substantially orthogonal to the first direction (e.g., the DR1 direction). For example, each first portion may feature first protrusions FLB1 extending from parallel (e.g., opposite sides) of a respective first portion FL1 in opposite directions of an axis represented by DR2 direction. The two protrusions FLB1 may be aligned in the second direction (e.g., the DR2 direction).

The first protrusions FLB1 may protrude from the first portion FL1 with respect to the first portion FL1 of the connection wire FL. In other words, the first protrusions FLB1 may protrude toward at least one of both sides along the second direction (e.g., the DR2 direction) from the first portion FL1 of the connection wire extending in the first direction (e.g., the DR1 direction). Also, a pair of first protrusions FLB1 protruding toward each other from two adjacent first portion FL1s among the first portion FL1s arranged side by side in the first sub-area SS1 may be arranged on the same line. For example, protrusions FLB1 extending toward one another from adjacent sides of different first portions FL1 may be aligned with one another in an axis represented by the second direction (e.g., the DR2 direction). In order to prevent a short circuit between the connection wires FL, ends of the first protrusions FLB1 extending toward each other from the two adjacent first portions FL1 are spaced apart from each other such that a gap may be formed therebetween. In the first sub-area SS1, the first portions FL1 and the first protrusions FLB1 may be arranged in a certain pattern in the pixel area CA.

The first protrusions FLB1 may extend in n the second direction (e.g., the DR2 direction). The first protrusions FLB1 may overlap an initialization voltage line VIL. The width of the initialization voltage line VIL may be greater than the width of the first protrusions FLB1, and may have a width that completely covers the width of the first protrusions FLB1.

In the second sub-area SS2, the second portions FL2 of the connection wires may extend in the second direction (e.g., the DR2 direction). In an exemplary embodiment of the present invention, the second portion FL2 may extend in the second direction (e.g., the DR2 direction) overlapping the initialization voltage line VIL. In an exemplary embodiment of the present invention, the width of the initialization voltage line VIL is greater than the width of the second portion FL2, and may have a width that completely covers the width of the second portion FL2.

The second portion FL2 may include second protrusions FLB2 protruding in the first direction (e.g., the DR1 direction).

The second protrusions FLB2 may protrude from the second portion FL2 with respect to the second portion FL2. The second protrusions FLB2 may protrude from parallel sides of a respective second portion FL2 in opposite directions of an axis represented by the DR1 direction. In other words, the second protrusions FLB2 may protrude toward at least one of both sides along the first direction (e.g., the DR1 direction) from the second portion FL2 of the connection wire FL extending in the second direction (e.g., the DR2 direction). Also, a pair of second protrusions FLB2 protruding toward each other from two adjacent second portions FL2 in the second sub-area SS2 may be arranged on the same line. In order to prevent a short circuit between the connection wires, ends of the second protrusions FLB2 extending toward each other from the two adjacent second portion FL2s are spaced apart from each other such that a gap may be formed therebetween. In the second sub-area SS2, the second portion FL2 and the second protrusions FLB2 may be arranged in a certain pattern in the pixel area CA.

In an exemplary embodiment of the present invention, the second protrusion FLB2 may extend in the first direction (e.g., the DR1 direction) and overlap the driving voltage line PL. In an exemplary embodiment of the present invention, the width of the driving voltage line PL may be greater than the width of the second protrusion FLB2, and may have a width that completely covers the width of the second protrusion FLB2.

In an exemplary embodiment of the present invention, a shielding electrode 173 and an upper connection electrode 177 may be further arranged in the pixel area CA. The shielding electrode 173 and the upper connection electrode 177 may be arranged on the same layer as the connection wires FL. Although FIG. 4 illustrates the shielding electrode 173 and the upper connection electrode 177 the present invention is not limited thereto. For example, according to exemplary embodiments of the present invention, electrodes of various numbers and shapes may be arranged in the pixel area CA. The shielding electrode 173 and the upper connection electrode 177 may prevent signal interference between a circuit portion and the connection wire, and may provide an increased efficiency in the manufacturing process by ensuring a pattern density.

The first area SR1 comprised of the first sub-area SS1, the second sub-area SS2 and the third area SS3 (see FIG. 1) which has been described in FIG. 4, may also be applied to the second area SR2 (see FIG. 1). Therefore, because the connection wire FL is also arranged in the second area SR2, light reflection (or scattering) characteristics are similar, and thus the first area and the second area may not be recognized by being distinguished from each other.

Figure 5:
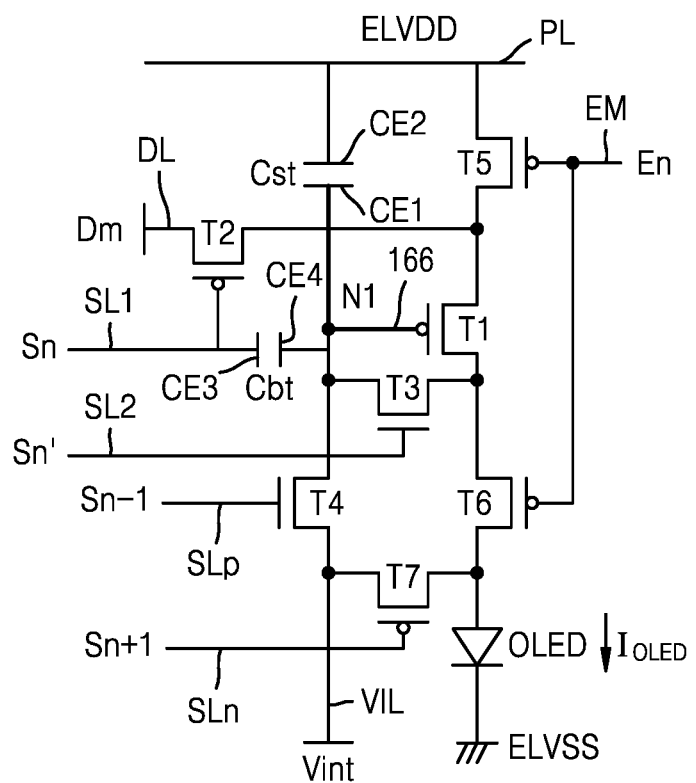
FIG. 5 is an equivalent circuit diagram of one pixel included in a display apparatus according to an embodiment according to an exemplary embodiment of the present invention.

FIG. 5 is an equivalent circuit diagram of one pixel included in the display apparatus according to an exemplary embodiment in the present invention.

Referring to FIG. 5, the pixel PX includes signal lines SL1, SL2, SLp, SLn, EM, and DL, a plurality of thin-film transistors T1, T2, T3, T4, T5, T6, T7 connected to the signal lines SL1, SL2, SLp, SLn, EM, and DL, a storage capacitor Cst, a boost capacitor Cbt, an initialization voltage line VIL, a driving voltage line PL, and an organic light-emitting diode OLED as a display element. In an exemplary embodiment of the present invention, at least one of the signal lines SL1, SL2, SLp, SLn, EM, and DL, for example, the initialization voltage line VIL and/or the driving voltage line PL may be shared by neighboring pixels PX.

The thin-film transistors may include a driving thin-film transistor T1, a switching thin-film transistor T2, a compensation thin-film transistor T3, a first initialization thin-film transistor T4, an operation control thin-film transistor T5, a light emission control thin-film transistor T6, and a second initialization thin-film transistor T7.

Some of the plurality of thin-film transistors T1, T2, T3, T4, T5, T6, and T7 may be provided as an n-channel MOSFET (NMOS), and the others may be provided as p-channel MOSFETs (PMOSs).

In an exemplary embodiment of the present invention, the compensation thin-film transistor T3 and the first initialization thin-film transistor T4 among the plurality of thin-film transistors T1, T2, T3, T4, T5, T6, and T7 may be provided as NMOSs, and the others may be provided as PMOSs.

In an exemplary embodiment of the present invention, the compensation thin-film transistor T3, the first initialization thin-film transistor T4, and the second initialization thin-film transistor T7 among the plurality of thin-film transistors T1, T2, T3, T4, T5, T6, and T7 may be provided as NMOSs, and the others may be provided as PMOSs. Alternatively, only one of the plurality of thin-film transistors T1, T2, T3, T4, T5, T6, and T7 may be provided as an NMOS, and the others may be provided as PMOSs. Alternatively, all of the plurality of thin-film transistors T1, T2, T3, T4, T5, T6, and T7 may be provided as NMOSs.

The signal lines may include a first scan line SL1 for transmitting a first scan signal Sn, a second scan line SL2 for transmitting a second scan signal Sn', a previous scan line SLp for transmitting a previous scan signal Sn−1 to the first initialization thin-film transistor T4, a light emission control line EM for transmitting a light emission control signal En to the operation control thin-film transistor T5 and the light emission control thin-film transistor T6, a next scan line SLn for transmitting a next scan signal Sn+1 to the second initialization thin-film transistor T7, and a data line DL crossing the first scan line SL1 and configured to transmit a data signal Dm.

The driving voltage line PL is configured to transmit a driving voltage ELVDD to the driving thin-film transistor T1, and the initialization voltage line VIL is configured to transmit an initialization voltage Vint for initializing the driving thin-film transistor T1 and the pixel electrode.

A driving gate electrode of the driving thin-film transistor T1 is connected to the storage capacitor Cst, a driving source electrode of the driving thin-film transistor T1 is connected to the driving voltage line PL via the operation control thin-film transistor T5, and a driving drain electrode of the driving thin-film transistor T1 is electrically connected to the pixel electrode of the organic light-emitting diode OLED via the light emission control thin-film transistor T6. The driving thin-film transistor T1 receives the data signal Dm according to a switching operation of the switching thin-film transistor T2 and supplies a driving current $I_{OLED}$ to the organic light-emitting diode OLED.

A switching gate electrode of the switching thin-film transistor T2 is connected to the first scan line SL1, a switching source electrode of the switching thin-film transistor T2 is connected to the data line DL, and a switching drain electrode of the switching thin-film transistor T2 is connected to the driving source electrode of the driving thin-film transistor T1 and is connected to the driving voltage line PL via the operation control thin-film transistor T5. The switching thin-film transistor T2 is turned on according to the first scan signal Sn received through the first scan line SL1 and performs a switching operation of transmitting the data signal Dm transmitted to the data line DL to the driving source electrode of the driving thin-film transistor T1.

A compensation gate electrode of the compensation thin-film transistor T3 is connected to the second scan line SL2. A compensation drain electrode of the compensation thin-film transistor T3 is connected to the driving drain electrode of the driving thin-film transistor T1 and is connected to the pixel electrode of the organic light-emitting diode OLED via the light emission control thin-film transistor T6. A compensation source electrode of the compensation thin-film transistor T3 is connected to a first electrode CE1 of the storage capacitor Cst and the driving gate electrode of the driving thin-film transistor T1 via a node connection line 166. Also, the compensation source electrode of the compensation thin-film transistor T3 is connected to a first initialization drain electrode of the first initialization thin-film transistor T4.

The compensation thin-film transistor T3 is turned on according to the second scan signal Sn' received through the second scan line SL2 and electrically connects the driving gate electrode and the driving drain electrode of the driving thin-film transistor T1 to diode-connect the driving thin-film transistor T1.

A first initialization gate electrode of the first initialization thin-film transistor T4 is connected to the previous scan line SLp. A first initialization source electrode of the first initialization thin-film transistor T4 is connected to a second initialization source electrode of the second initialization thin-film transistor T7 and the initialization voltage line VIL. The first initialization drain electrode of the first initialization thin-film transistor T4 is connected to the first electrode CE1 of the storage capacitor Cst, the compensation source electrode of the compensation thin-film transistor T3, and the driving gate electrode of the driving thin-film transistor T1. The first initialization thin-film transistor T4 is turned on according to the previous scan signal Sn−1 received through the previous scan line SLp and transmits the initialization voltage Vint to the driving gate electrode of the driving thin-film transistor T1 to perform an initialization operation for initializing a voltage of the driving gate electrode of the driving thin-film transistor T1.

An operation control gate electrode of the operation control thin-film transistor T5 is connected to the light emission control line EM, an operation control source electrode of the operation control thin-film transistor T5 is connected to the driving voltage line PL, and an operation control drain electrode of the operation control thin-film transistor T5 is connected to the driving source electrode of the driving thin-film transistor T1 and the switching drain electrode of the switching thin-film transistor T2.

A light emission control gate electrode of the light emission control thin-film transistor T6 is connected to the light emission control line EM, a light emission control source electrode of the light emission control thin-film transistor T6 is connected to the driving drain electrode of the driving thin-film transistor T1 and the compensation drain electrode of the compensation thin-film transistor T3, and a light emission control drain electrode of the light emission control thin-film transistor T6 is electrically connected to the second initialization drain electrode of the second initialization thin-film transistor T7 and the pixel electrode of the organic light-emitting diode OLED.

The operation control thin-film transistor T5 and the light emission control thin-film transistor T6 are simultaneously turned on according to the light emission control signal En received through the light emission control line EM, and the driving voltage ELVDD is transmitted to the OLED such that the driving current $I_{OLED}$ flows through the organic light-emitting diode OLED.

A second initialization gate electrode G7 of the second initialization thin-film transistor T7 is connected to the next scan line SLn, a second initialization drain electrode of the second initialization thin-film transistor T7 is connected to the light emission control drain electrode of the light emission control thin-film transistor T6 and the pixel electrode of the organic light-emitting diode OLED, and a second initialization source electrode of the second initialization thin-film transistor T7 is connected to the first initialization source electrode of the first initialization thin-film transistor T4 and the initialization voltage line VIL. The second initialization thin-film transistor T7 is turned on according to the next scan signal Sn+1 received through the next scan line SLn to initialize the pixel electrode of the organic light-emitting diode OLED.

As illustrated in FIG. 5, the second initialization thin-film transistor T7 may be connected to the next scan line SLn. In another embodiment, the second initialization thin-film transistor T7 may be connected to the light emission control line EM and driven according to the light emission control signal En. The positions of the source electrodes and the drain electrodes in FIG. 2 may be changed according to the type (p-type or n-type) of the transistors.

The storage capacitor Cst includes the first electrode CE1 and the second electrode CE2. The first electrode CE1 of the storage capacitor Cst is connected to the driving gate electrode of the driving thin-film transistor T1, and the second electrode CE2 of the storage capacitor Cst is connected to the driving voltage line PL. The storage capacitor Cst may store a charge corresponding to a difference between a voltage of the driving gate electrode of the driving thin-film transistor T1 and the driving voltage ELVDD.

The boost capacitor Cbt includes a third electrode CE3 and a fourth electrode CE4. The third electrode CE3 may be connected to the switching gate electrode of the switching thin-film transistor T2 and the first scan line SL1, and the fourth electrode CE4 may be connected to the compensation source electrode of the compensation thin-film transistor T3 and the node connection line 166. When the first scan signal Sn supplied to the first scan line SL1 is turned off, the boost capacitor Cbt may increase the voltage of a first node N1. As described above, when the voltage of the first node N1 is increased, the black gradation may be clearly expressed.

The first node N1 may be an area where the driving gate electrode of the driving thin-film transistor T1, the source electrode of the compensation thin-film transistor T3, the drain electrode of the first initialization thin-film transistor T4, and the fourth electrode CE4 of the boost capacitor Cbt are connected.

A detailed operation of each pixel PX according to an exemplary embodiment of the present invention is as follows.

During an initialization period, when the previous scan signal Sn−1 is supplied through the previous scan line SLp, the first initialization thin-film transistor T4 is turned on in response to the previous scan signal Sn−1, and the driving thin-film transistor T1 is initialized by the initialization voltage Vint supplied from the initialization voltage line VIL.

During a data programming period, when the first scan signal Sn and the second scan signal Sn' are supplied through the first scan line SL1 and the second scan line SL2, respectively, the switching thin-film transistor T2 and the compensation thin-film transistor T3 are turned on in response to the first scan signal Sn and the second scan signal Sn', respectively. Herein, the driving thin-film transistor T1 is diode-connected by the turned-on compensation thin-film transistor T3, and is biased in a forward direction.

Then, a compensation voltage Dm+Vth (Vth is a negative value) Obtained by subtracting a threshold voltage Vth of the driving thin-film transistor T1 from the data signal Dm supplied from the data line DL is applied to the driving gate electrode G1 (see, e.g., FIG. 6) of the driving thin-film transistor T1.

The driving voltage ELVDD and the compensation voltage Dm+Vth are applied to respective ends of the storage capacitor Cst, and a charge corresponding to a voltage difference between both ends are stored in the storage capacitor Cst.

During a light emission period, the operation control thin-film transistor T5 and the light emission control thin-film transistor T6 are turned on by the light emission control signal En supplied from the light emission control line EM. A driving current $I_{OLED}$ according to a voltage difference between the voltage of the driving gate electrode G1 of the driving thin-film transistor T1 and the driving voltage ELVDD is generated, and the driving current $I_{OLED}$ is supplied to the organic light-emitting diode OLED through the light emission control thin-film transistor T6.

In an exemplary embodiment of the present invention, at least one of the plurality of thin-film transistors T1, T2, T3, T4, T5, T6, and T7 includes a semiconductor layer containing an oxide, and the others include a semiconductor layer containing silicon.

For example, a driving thin-film transistor directly affecting the brightness of the display apparatus is configured to include a semiconductor layer formed of polycrystalline silicon having high reliability, and thus a high-resolution display apparatus may be implemented.

Because oxide semiconductors have high carrier mobility and low leakage current, a voltage drop is not large even when the driving time is long. In other words, even during low-frequency driving, the color change of an image due to the voltage drop is not large, and thus low-frequency driving may be realized.

As described above, because the oxide semiconductors have a low leakage current, at least one of the compensation thin-film transistor T3, the first initialization thin-film transistor T4, and the second initialization thin-film transistor T7, which are connected to the driving gate electrode G1 of the driving thin-film transistor T1 is used as the oxide semiconductor, and thus a leakage current that may flow to the driving gate electrode G1 may be prevented and the power consumption may be reduced.

Figure 6:
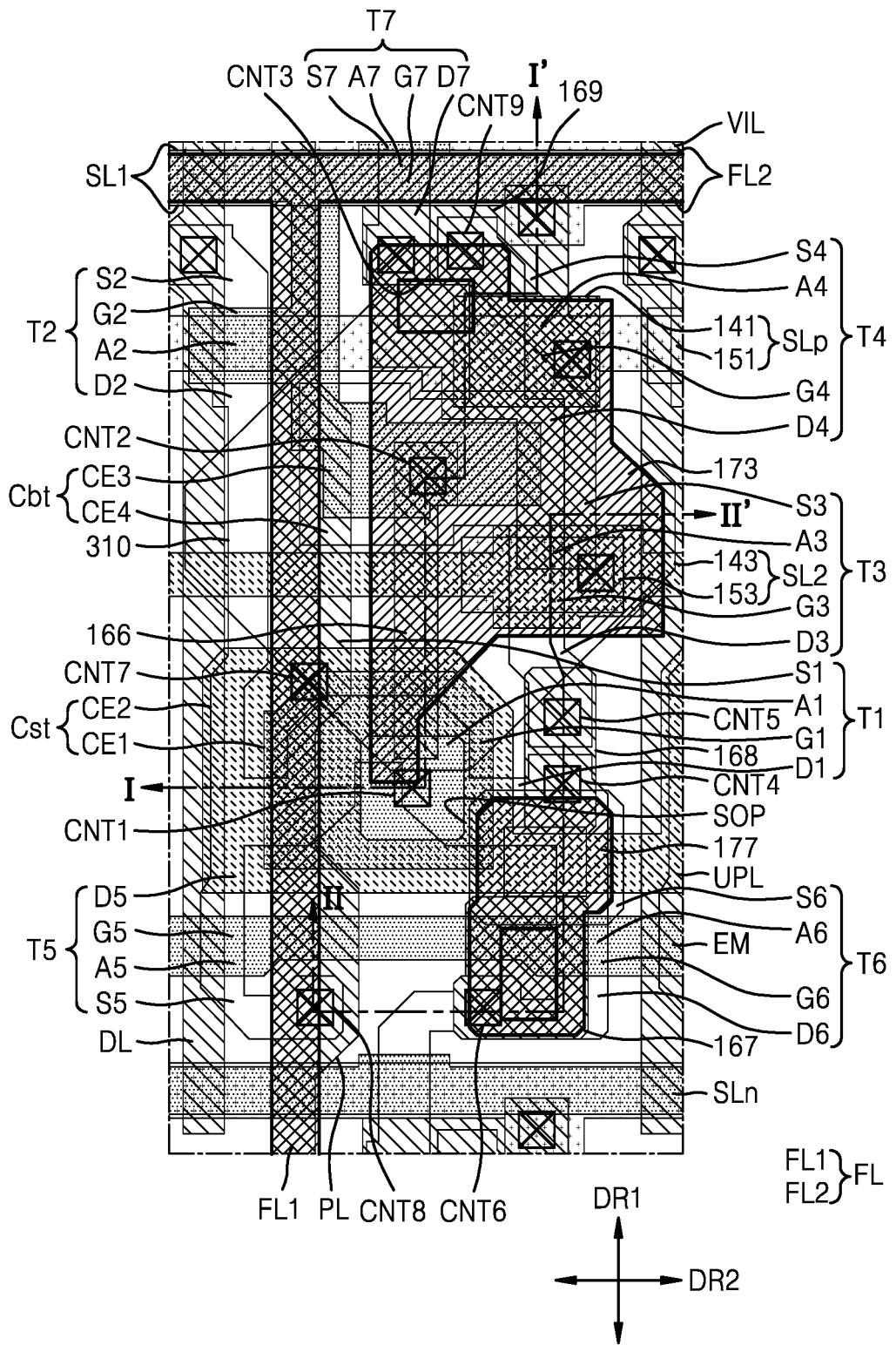
FIG. 6 is a schematic layout view of positions of a plurality of thin-film transistors and capacitors arranged in one pixel circuit of a display apparatus according to an exemplary embodiment of the present invention.
Figure 7:
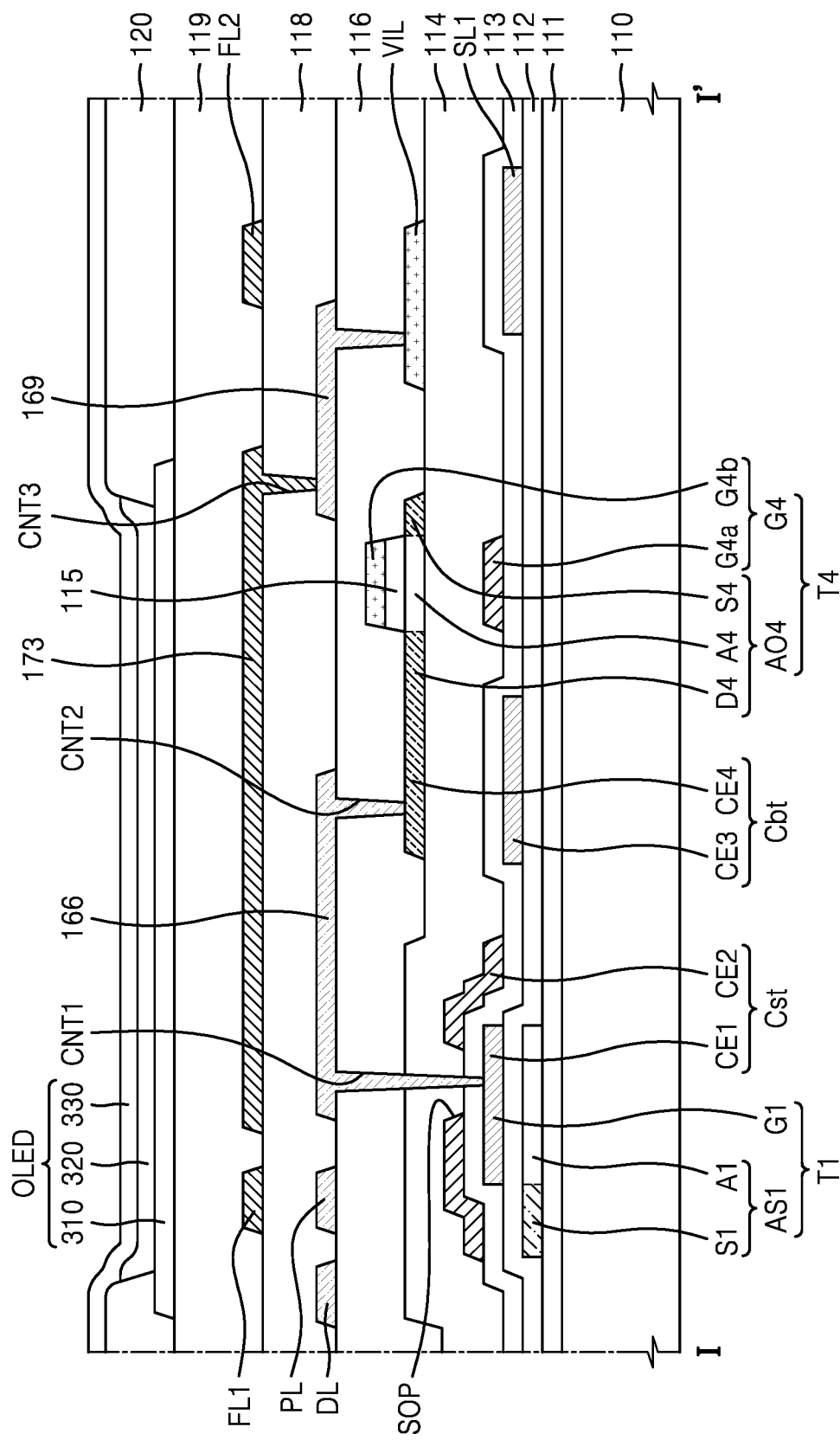
FIG. 7 is a schematic cross-sectional view taken along a line I-I' of FIG. 6 according to an exemplary embodiment of the present invention.
Figure 8:
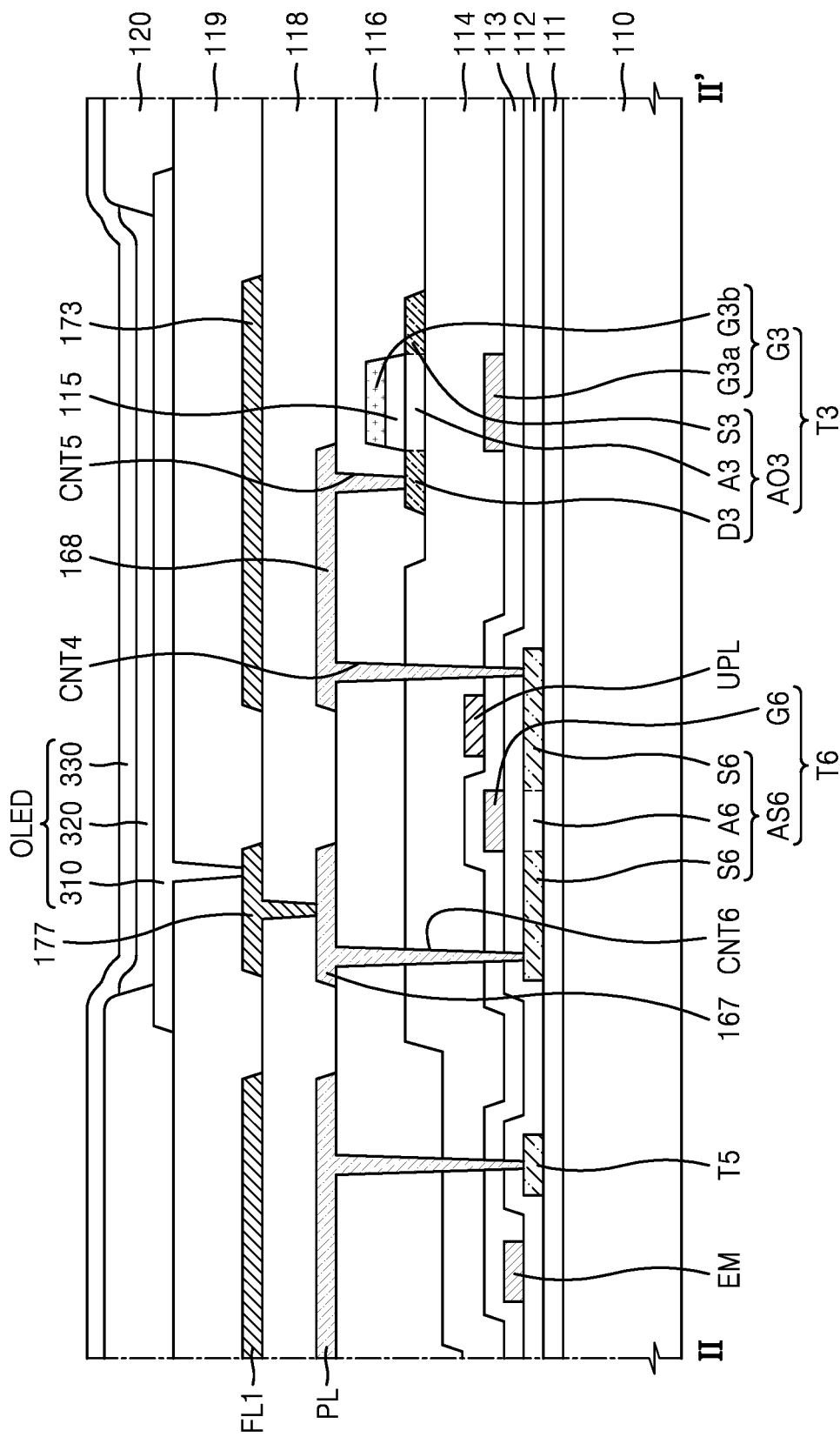
FIG. 8 is a schematic cross-sectional view taken along a line II-II' of FIG. 6 according to an exemplary embodiment of the present invention.

FIG. 6 is a schematic layout view of positions of a plurality of thin-film transistors and capacitors arranged in one pixel circuit of the display apparatus according to an exemplary embodiment of the present invention. In particular, FIG. 6 is an enlarged view of the area C of FIG. 4. FIG. 7 is a schematic cross-sectional view taken along line I-I' of FIG. 6, and FIG. 8 is a schematic cross-sectional view taken along line II-II' of FIG. 6.

Referring to FIG. 6, a pixel circuit of the display apparatus according to an exemplary embodiment of the present invention includes a data line DL and a driving voltage line PL extending along the first direction (e.g., the DR1 direction), and includes a first scan line SL1, a second scan line SL2, a previous scan line SLp, a next scan line SLn, a light emission control line EM, and an initialization voltage line VIL extending along the second direction (e.g., the DR2 direction) crossing the first direction (e.g., the DR1 direction). Also, a connection wire FL for connecting the data line DL to a pad portion may be provided in a display area DA.

The pixel circuit may include a driving thin-film transistor T1, a switching thin-film transistor T2, a compensation thin-film transistor T3, a first initialization thin-film transistor T4, an operation control thin-film transistor T5, a light emission control thin-film transistor T6, a second initialization thin-film transistor T7, a storage capacitor Cst, and a boost capacitor Cbt.

In an exemplary embodiment of the present invention, the driving thin-film transistor T1, the switching thin-film transistor T2, the operation control thin-film transistor T5, the light emission control thin-film transistor T6, and the second initialization thin-film transistor T7 may be provided as thin-film transistors including a silicon semiconductor.

Also, the compensation thin-film transistor T3 and the first initialization thin-film transistor T4 may be provided as thin-film transistors including an oxide semiconductor.

Semiconductor layers of the driving thin-film transistor T1, the switching thin-film transistor T2, the operation control thin-film transistor T5, the light emission control thin-film transistor T6, and the second initialization thin-film transistor T7 are arranged on the same layer and include the same material. For example, the semiconductor layer may be formed of polycrystalline silicon.

The semiconductor layers of the driving thin-film transistor T1, the switching thin-film transistor T2, the operation control thin-film transistor T5, the light emission control thin-film transistor T6, and the second initialization thin-film transistor T7 may be arranged on a buffer layer 111 (see FIG. 7) arranged on the substrate 110.

The semiconductor layers of the driving thin-film transistor T1, the switching thin-film transistor T2, the operation control thin-film transistor T5, the light emission control thin-film transistor T6, and the second initialization thin-film transistor T7 may be connected to each other and may be bent in various shapes.

The semiconductor layers of the driving thin-film transistor T1, the switching thin-film transistor T2, the operation control thin-film transistor T5, the light emission control thin-film transistor T6, and the second initialization thin-film transistor T7 may include a channel area, and a source area and a drain area at opposing sides of the channel area, respectively. For example, the source area and the drain area may be doped with impurities, and the impurities may include N-type impurities or P-type impurities. The source area and the drain area correspond to a source electrode and a drain electrode, respectively. Hereinafter, the terms source area and drain area are used instead of the terms source electrode and the drain electrode.

The driving thin-film transistor T1 includes a driving semiconductor layer and the driving gate electrode G1. The driving semiconductor layer includes a driving channel area A1, and a driving source area S1 and a driving drain area D1 at opposing sides (e.g., parallel sides spaced apart in the first direction (e.g., the DR1 direction)) of the driving channel area A1. The driving semiconductor layer has a curved shape, and thus the driving channel area A1 may be longer than the other channel areas A2 to A7. For example, the driving semiconductor layer has a shape bent several times such as an omega or an alphabet "S," and thus a long channel may be formed in a narrow space. Because the driving channel area A1 is formed long, a driving range of a gate voltage applied to the driving gate electrode G1 is widened, such that the gradation of light emitted from an organic light-emitting diode OLED may be more precisely controlled and the display quality may be increased. The driving gate electrode G1 is of an island type and overlaps the driving channel area A1 with the first gate insulating layer 112 (see FIG. 7) therebetween.

The storage capacitor Cst may be arranged to overlap the driving thin-film transistor T The storage capacitor Cst includes a first electrode CE1 and a second electrode CE2. The driving gate electrode G1 may function as the gate electrode of the driving thin-film transistor T1 as well as the first electrode CE1 of the storage capacitor Cst. In other words, it may be understood that the driving gate electrode G1 and the first electrode CE1 are integrally formed. The second electrode CE2 of the storage capacitor Cst at least partially overlaps the first electrode CE1 with the second gate insulating layer 113 (see FIG. 7) therebetween. Herein, the second gate insulating layer 113 may serve as a dielectric layer of the storage capacitor Cst.

The second electrode CE2 may include a storage opening SOP. The storage opening SOP may be formed by removing a part of the second electrode CE2, and may have a closed shape. The node connection line 166 may be connected to the first electrode CE1 through a first contact hole CNT1 arranged in the storage opening SOP. The second electrode CE2 may be connected to the driving voltage line PL through a seventh contact hole CNT7. The second electrode CE2 may extend in the second direction (e.g., the DR2 direction) to transmit a driving voltage ELVDD in the second direction (e.g., the DR2 direction). Thus, a plurality of the driving voltage lines PL and a plurality of the second electrodes CE2 may form a mesh structure in the display area DA.

The switching thin-film transistor T2 includes a switching semiconductor layer and a switching gate electrode G2. The switching semiconductor layer includes a switching channel area A2, and a switching source area S2 and a switching drain area D2 at opposing sides of the switching channel area A2 (e.g., parallel sides spaced apart in the first direction (e.g., the DR1 direction)). The switching source area S2 is connected to the data line DL through a contact hole and a connection electrode, and the switching drain area D2 is connected to the driving source area S1. In an exemplary embodiment of the present invention, the switching gate electrode G2 may be provided by protruding in the second direction(e.g., the DR2 direction) as a part of the first scan line SL1.

The operation control thin-film transistor T5 includes an operation control semiconductor layer and an operation control gate electrode G5. The operation control semiconductor layer includes an operation control channel area A5, and an operation control source area S5 and an operation control drain area D5 at opposing sides of the operation control channel area A5 (e.g., parallel sides spaced apart in the first direction (e.g., the DR1 direction)). The operation control source area S5 may be connected to the driving voltage line PL through an eighth contact hole CNT8, and the operation control drain area D5 may be connected to the driving source area S1. The operation control gate electrode G5 is provided as a part of the light emission control line EM.

The light emission control thin-film transistor T6 includes a light emission control semiconductor layer and a light emission control gate electrode G6. The light emission control semiconductor layer includes a light emission control channel area A6, and a light emission control source area S6 and a light emission control drain area D6 at opposing sides of the light emission control channel area A6 (e.g., parallel sides spaced apart in the first direction (e.g., the DR1 direction)). The light emission control source area S6 may be connected to the driving drain area D1, and the light emission control drain area D6 may be connected to a first connection electrode 167 through a sixth contact hole CNT6. The first connection electrode 167 may be connected to the pixel electrode 310 (see FIG. 7) of the organic light-emitting diode OLED through an upper connection electrode 177 arranged on another layer. The light emission control gate electrode G6 is provided as a part of the light emission control line EM.

The second initialization thin-film transistor T7 includes a second initialization semiconductor layer and a first initialization gate electrode G7. The second initialization semiconductor layer includes a second initialization channel area A7, a second initialization source area S7 and a second initialization drain area D7 at opposing sides of the second initialization channel area A7. The second initialization source area S7 may be connected to the initialization voltage line VIL via a third connection electrode 169, and the second initialization drain area D7 may be connected to the light emission control drain area D6. The second initialization gate electrode G7 is provided as a part of the next scan line SLn.

A first interlayer insulating layer 114 (see FIG. 7) may be arranged on the thin-film transistors T1, T2, T5, T6, and T7 including the silicon semiconductor, and the thin-film transistors T3 and T4 including the oxide semiconductor may be arranged on the first interlayer insulating layer 114.

Semiconductor layers of the compensation thin-film transistor T3 and the first initialization thin-film transistor T4 are arranged on the same layer and include the same material. For example, the semiconductor layers may be formed of an oxide semiconductor.

Each of the semiconductor layers may include a channel area, and a source area and a drain area at opposing sides (e.g., parallel sides spaced apart in the first direction (e.g., the DR1 direction)) of the channel area. For example, the source area and the drain area may be areas having a carrier concentration increased by plasma treatment. The source area and the drain area correspond to a source electrode and a drain electrode, respectively. Hereinafter, the terms 'source area' and 'drain area' my also be used instead of the source electrode and the drain electrode.

The compensation thin-film transistor T3 includes a compensation semiconductor layer including an oxide semiconductor and a compensation gate electrode G3. The compensation semiconductor layer includes a compensation channel area A3, and a compensation source area S3 and a compensation drain area D3 at opposing sides (e.g., parallel sides spaced apart in the first direction (e.g., the DR1 direction)) of the compensation channel area A3. The compensation source area S3 may be bridge-connected to the driving gate electrode G1 through the node connection line 166. One end (e.g., a first end) of the node connection line 166 may be connected to the compensation source area S3 through a second contact hole CNT2, and the other end (e.g., a second end) of the node connection line 166 may be connected to the driving gate electrode G1 through the first contact hole CNT1. Also, the compensation source area S3 may be connected to the first initialization drain area D4 arranged on the same layer. The compensation drain area D3 may be connected to the driving semiconductor layer of the driving thin-film transistor T1 and the light emission control semiconductor layer of the light emission control thin-film transistor T6 via a second connection electrode 168. The compensation gate electrode G3 is provided as a part of the second scan line SL2.

The first initialization thin-film transistor T4 includes a first initialization semiconductor layer including an oxide semiconductor and a first initialization gate electrode G4. The first initialization semiconductor layer includes a first initialization channel area A4, a first initialization source area S4 and a first initialization drain area D4 at opposing sides (e.g., parallel sides spaced apart in the first direction (e.g., the DR1 direction)) of the first initialization channel area A4. The first initialization source area S4 may be connected to the third connection electrode 169 through a ninth contact hole CNT9, and the third connection electrode 169 may be connected to the initialization voltage line VIL through the contact hole. The first initialization drain area D4 may be bridge-connected to the driving gate electrode G1 through the node connection line 166. The first initialization gate electrode G4 is provided as a part of the previous scan line SLp.

A third gate insulating layer 115 (see FIG. 7) is arranged between the compensation semiconductor layer and the compensation gate electrode G3 and between the first initialization semiconductor layer and the first initialization gate electrode G4 to correspond to the respective channel areas.

The third electrode CE3, which is one electrode of the boost capacitor Cbt, is provided as a part of the first scan line SL1 and is connected to the switching gate electrode G2. The fourth electrode CE4 of the boost capacitor Cbt may be arranged to overlap the third electrode CE3, and may be provided as an oxide semiconductor. The fourth electrode CE4 may be arranged on the same layer as the compensation semiconductor layer of the compensation thin-film transistor T3 and the semiconductor layer of the first initialization thin-film transistor T4, and may be provided in an area between the compensation semiconductor layer and the first initialization semiconductor layer. Alternatively, the fourth electrode CE4 may extend from the first initialization semiconductor layer. Alternatively, the fourth electrode CE4 may extend from the compensation semiconductor layer.

A second interlayer insulating layer 116 (see FIG. 7) may be arranged on the thin-film transistors T3 and T4 including the oxide semiconductor, and the driving voltage line PL, the node connection line 166, and the connection electrodes 167, 168, and 169 may be arranged on the second interlayer insulating layer 116.

In an exemplary embodiment of the present invention, a first planarizing layer 118 (see FIG. 7) may be arranged to cover the driving voltage line PL and the data line DL, and a shielding electrode 173 may be arranged on the first planarizing layer 118.

The shielding electrode 173 may be arranged on the node connection line 166 across both the portion connected to the driving gate electrode G1 and the portion connected to the fourth electrode CE4. When the shielding electrode 173 is not so arranged, the node connection line 166 may form a coupling capacitance with the pixel electrode 310 (see FIG. 7) of the display element arranged thereon. Accordingly, the thin-film transistors connected to the node connection line 166 may be affected.

In the present exemplary embodiment of the present invention, the shielding electrode 173 is arranged on the node connection line 166, and a constant voltage is applied to the shielding electrode 173, thereby minimizing the influence of the coupling capacitance. In an embodiment, the shielding electrode 173 may be connected to the third connection electrode 169 through a third contact hole CNT3. The third connection electrode 169 may be connected to the initialization voltage line VIL via the contact hole. Accordingly, a reference voltage Vint may be applied to the shielding electrode 173. In some exemplary embodiments of the present inventive concept, the shielding electrode 173 may be connected to the driving voltage line PL through a contact hole. Accordingly, the driving voltage ELVDD may be applied to the shielding electrode 173.

In some exemplary embodiments of the present invention, the shielding electrode 173 may be formed to cover the entire node connection line 166. In some exemplary embodiments of the present invention, the shielding electrode 173 may be arranged to overlap at least a part of the driving thin-film transistor T1, the compensation thin-film transistor T3, and/or the first initialization thin-film transistor T4.

In an exemplary embodiment of the present invention, the first scan line SL1, the next scan line SLn, and the light emission control line EM may be formed of the same material and on the same layer as the driving gate electrode G1.

In an exemplary embodiment of the present invention, although FIG. 6 illustrates that the first scan line SL1 extends in the first direction (e.g., the DR1 direction) to include the boost capacitor Cbt, the third electrode CE3 of the boost capacitor Cbt may be included as part of the first scan line SL1. In this case, the first scan line SL1 may extend in the second direction (e.g., the DR2 direction) with respect to the third electrode CE3 of the boost capacitor Cbt.

In an exemplary embodiment of the present invention, some of the wires may be provided as two conductive layers arranged on different layers. For example, the second scan line SL2 may include a lower scan line 143 and an upper scan line 153 that are arranged on different layers. The lower scan line 143 may be formed of the same material and on the same layer as the second electrode CE2 of the storage capacitor Cst, and the upper scan line 153 may be arranged on a third gate insulating layer 115 (see FIG. 7). The lower scan line 143 may be arranged to at least partially overlap the upper scan line 153. The lower scan line 143 and the upper scan line 153 correspond to a part of the compensation gate electrode of the compensation thin-film transistor T3, and thus the compensation thin-film transistor T3 may have a double-gate structure in which gate electrodes are respectively arranged on and under the semiconductor layer.

Also, in an exemplary embodiment of the present invention, the previous scan line SLp may include a lower previous scan line 141 and an upper previous scan line 151 that are arranged on different layers. The lower previous scan line 141 may be formed of the same material and on the same layer as the second electrode CE2 of the storage capacitor Cst, and the upper previous scan line 151 may be arranged on the third gate insulating layer 115 (see FIG. 7). The lower previous scan line 141 may be arranged to at least partially overlap the upper previous scan line 151. The lower previous scan line 141 and the upper previous scan line 151 correspond to a part of the first initialization gate electrode G4 of the first initialization thin-film transistor T4, and thus the first initialization thin-film transistor T4 may have a dual gate structure in which gate electrodes are respectively arranged on and under the semiconductor layer. In another exemplary embodiment of the present invention, the first initialization thin-film transistor T4 may include one gate electrode and may at least partially overlap the semiconductor layer. In this case, the first initialization thin-film transistor T4 may have a single-gate structure.

In an exemplary embodiment of the present invention, the initialization voltage line VIL may be arranged over the first interlayer insulating layer 114 (see FIG. 7) covering the lower scan line 143. For example, the initialization voltage line VIL may be arranged on the same layer as the previous scan line SLp. In this case, the initialization voltage line VIL may be arranged to overlap the first scan line SL1. Accordingly, the areas of the third electrode CE3 and the fourth electrode CE4 of the boost capacitor Cbt are increased, and thus the capacitance of the boost capacitor Cbt may be increased. In another exemplary embodiment of the present invention, the initialization voltage line VIL may be arranged on the same layer as the lower scan line 143. In this case, the initialization voltage line VIL may be spaced apart from the first scan line SL1 and may not overlap the first scan line SL1.

The connection wire FL may include a first portion FL1 and a third portion extending in the first direction (e.g., the DR1 direction) and a second portion FL2 extending in the second direction (e.g., the DR2 direction), and the first portion FL1, the second portion FL2, and the third portion of the connection wire FL may include protrusions.

In an exemplary embodiment of the present invention, the first portion FL1 may overlap the driving voltage line PL. For example, the first portion FL1 may extend in the first direction (e.g., the DR1 direction) to successively overlap the driving voltage line PL. In another exemplary embodiment of the present invention, the first portion FL1 may be spaced apart from the driving voltage line PL.

The second portion FL2 may overlap the initialization voltage line VIL. For example, the second portion FL2 may extend in the second direction (e.g., the DR2 direction) to successively overlap the initialization voltage line VIL. In this case, the initialization voltage line VIL may be arranged between the first scan line SL1 and the second portion FL2. Accordingly, distortion of data signals transmitted to the second portion FL2 may be prevented by scan signals transmitted to the first scan line SL1.

In an exemplary embodiment of the present invention, the connection wire FL may be arranged on the same layer as the shielding electrode 173. In another exemplary embodiment of the present invention, the connection wire FL may be arranged on the shielding electrode 173.

In an exemplary embodiment of the present invention, the pixel electrode 310 may overlap the first portion FL1 or the second portion FL2 of the connection wire FL. For example, the pixel electrode 310 may overlap the first portion FL1 and/or the second protrusion of the second portion FL2 extending in the first direction (e.g., the DR1 direction).

The second portion FL2 of the connection wire FL is parallel to the scan line, and thus distortion of the data signals transmitted to the connection wire FL may occur due to the scan signals transmitted to the scan line, and an oblique stain may occur. According to an exemplary embodiment of the present invention, the connection wire FL may overlap the initialization voltage line VIL or the driving voltage line PL. Accordingly, the driving voltage line PL or the initialization voltage line VIL serves as a shielding line that blocks signal interference between the connection wire FL and the scan line, thereby minimizing or preventing parasitic capacitance. Thus, distortion of the data signals of the connection wire FL may be minimized or prevented.

Hereinafter, a structure of the display apparatus according to an exemplary embodiment of the present invention will be described in detail with reference to FIGS. 7 and 8. FIGS. 7 and 8 illustrate structures of the driving thin-film transistor T1, the compensation thin-film transistor T3, the first initialization thin-film transistor T4, the light emission control thin-film transistor T6, the storage capacitor Cst, and the boost capacitor Cbt.

Referring to FIGS. 7 and 8, the display apparatus according to an exemplary embodiment of the present invention includes a substrate 110, a first thin-film transistor including a silicon semiconductor, a second thin-film transistor including an oxide semiconductor, a driving voltage line PL extending in a first direction (e.g., the DR1 direction) in a display area, a data line DL spaced apart from the driving voltage line PL, and a connection wire connecting the data line DL to a pad portion. The connection wire may include a first portion FL1 extending in the first direction (e.g., the DR1 direction) and a second portion FL2 extending in the second direction (e.g., the DR2 direction), and the first portion FL1 may overlap the driving voltage line PL.

Also, the display apparatus may further include various insulating layers such as a buffer layer 111, a first gate insulating layer 112, a second gate insulating layer 113, a third gate insulating layer 115, a first interlayer insulating layer 114, a second interlayer insulating layer 116, a first planarizing layer 118, and a second planarizing layer 119.

The substrate 110 may include a glass material, a ceramic material, a metal material, and/or a flexible or bendable material. When the substrate 110 has a flexible or bendable characteristic, the substrate 110 may include a polymer resin such as polyethersulphone, polyacrylate, polyetherimide, polyethylene naphthalate, polyethylene terephthalate, polyphenylene sulfide, polyarylate, polyimide, polycarbonate, and/or cellulose acetate propionate. The substrate 110 may have a single-layer structure or a multi-layer structure of the above materials, and may further include an inorganic layer in the case of the multi-layer structure. In some exemplary embodiments of the present invention, the substrate 110 may have an organic/inorganic/organic stacked structure.

The buffer layer 111 may increase the flatness of an upper surface of the substrate 110, and the buffer layer 111 may be formed of an oxide layer such as silicon oxide (SiOx), and/or a nitride layer such as silicon nitride (SiNx), and/or silicon oxynitride (SiON).

A barrier layer may be further included between the substrate 110 and the buffer layer 111. The barrier layer may prevent or minimize penetration of impurities from the substrate 110 or the like into the silicon semiconductor layer. The barrier layer may include an inorganic material such as an oxide or a nitride and/or an organic material, and may have a single-layer or multi-layer structure of the inorganic material and the organic material.

A driving semiconductor layer AS1 of the driving thin-film transistor T1 and a light emission control semiconductor layer AS6 of the light emission control thin-film transistor T6, which are semiconductor layers including a silicon semiconductor, may be arranged on the buffer layer 111.

The driving semiconductor layer AS1 may include a driving source area S1 and a driving drain area D1 that are doped with impurities, are conductive, and are spaced apart from each other, and a driving channel area A1 arranged therebetween. The driving source area S1 and the driving drain area D1 may correspond to the source electrode and the drain electrode of the driving thin-film transistor T1, respectively, and the driving source area S1 and the driving drain area may be switched in position.

The light emission control semiconductor layer AS6 may include a light emission control source area S6 and a light emission control drain area D6 that are doped with impurities, are conductive, and are spaced apart from each other, and a light emission control channel area A6 arranged therebetween. The light emission control source area S6 and the light emission control drain area D6 may correspond to the source electrode and the drain electrode of the light emission control thin-film transistor T6, respectively, and the light emission control source area S6 and the light emission control drain area D6 may be switched in position.

The driving gate electrode G1 is arranged on the driving semiconductor layer AS1, and the light emission control gate electrode G6 is arranged on the light emission control semiconductor layer AS6. The first gate insulating layer 112 may be arranged between the driving semiconductor layer AS1 and the driving gate electrode G1, and between the light emission control semiconductor layer AS6 and the light emission control gate electrode G6. Also, the first scan line SL1 and/or the light emission control line EM may be arranged on the same layer as the driving gate electrode G1 and/or the light emission control gate electrode G6. For example, the first scan line SL1 and/or the light emission control line EM and the driving gate electrode G1 may be arranged on the first gate insulating layer 112 covered by the second gate insulating layer 113.

The first gate insulating layer 112 may include an inorganic material containing an oxide or a nitride. For example, the first gate insulating layer 112 may include silicon oxide (SiO2), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). The driving gate electrode G1 may be arranged to overlap the driving channel area A1, and may be formed of a single layer or multiple layers including Mo, Cu, Ti, or the like.

A storage capacitor Cst may be formed on the driving gate electrode G1 to overlap the driving gate electrode G1. The storage capacitor Cst includes a first electrode CE1 and a second electrode CE2. The second gate insulating layer 113 may be arranged between the first electrode CE1 and the second electrode CE2. Herein, the driving gate electrode G1 may function as the gate electrode of the driving thin-film transistor T1 as well as the first electrode CE1 of the storage capacitor Cst. In other words, it may be understood that the driving gate electrode G1 and the first electrode CE1 are integrally formed.

The second gate insulating layer 113 may include an inorganic material containing an oxide or a nitride. For example, the second gate insulating layer 113 may include silicon oxide (SiO2), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

The second electrode CE2 may be arranged on the second gate insulating layer 113 to overlap the first electrode CE1.

The second electrode CE2 may include a storage opening SOP. The storage opening SOP is formed by removing a part of the second electrode CE2, and may have a closed-line shape. A first contact hole CNT1 defined in the second gate insulating layer 113 may be arranged in the storage opening SOP. The driving gate electrode G1 and the node connection line 166 may be connected through the first contact hole CNT1. The second electrode CE2 may include molybdenum (Mo), copper (Cu), titanium (Ti), or the like, and may be formed of a single layer or multiple layers. A lower voltage line UPL (shown in FIG. 6 or FIG. 8) may be arranged on the same layer as the second electrode CE2. For example, the lower voltage line in and the second electrode CE2 may be arranged on the second gate insulating layer 113 and covered by a first interlayer insulating layer 114.

The first interlayer insulating layer 114 may be arranged on the second electrode CE2. The first interlayer insulating layer 114 may include an inorganic material containing an oxide and/or a nitride. For example, the first interlayer insulating layer 114 may include silicon oxide (SiO2), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

A compensation semiconductor layer AO3 included in the compensation thin-film transistor T3 and a first initialization semiconductor layer AO4 included in the first initialization thin-film transistor T4, each including oxide semiconductors may be arranged on the first interlayer insulating layer 114. The compensation semiconductor layer AO3 may include a compensation source area S3 and a compensation drain area D3 having conductivity and spaced apart from each other, and a compensation channel area A3 arranged between the compensation source area S3 and the compensation drain area D3.

The first initialization semiconductor layer AO4 may include a first initialization source area S4 and a first initialization drain area D4 having conductivity and spaced apart from each other, and a first initialization channel area A4 arranged between the first initialization source area S4 and the first initialization drain area D4.

The compensation semiconductor layer AO3 and the first initialization semiconductor layer AO4 may be formed of a Zn oxide-based material, such as Zn oxide, In—Zn oxide, and/or Ga—In—Zn oxide. In some exemplary embodiments of the present invention, the compensation semiconductor layer AO3 and the first initialization semiconductor layer AO4 may include IGZO (In-Ga—Zn-O), ITZO (In—Sn—Zn—O), and/or IGZO (In—Ga—Sn—Zn—O) semiconductors that contain ZnO with a metal such as indium (In), gallium (Ga), and/or tin (Sn).

The compensation source area S3, the compensation drain area D3, the first initialization source area S4, and the first initialization drain area D4 may be formed by adjusting a carrier concentration of an oxide semiconductor and conducting the oxide semiconductor. For example, the compensation source area S3 and the compensation drain area D3, the first initialization source area S4, and the first initialization drain area D4 may be formed by increasing a carrier concentration of the oxide semiconductor through plasma treatment using a hydrogen (H)-based gas, a fluorine (F)-based gas, or a combination thereof.

A first lower gate electrode G3a may be arranged under the compensation semiconductor layer AO3, and a first upper gate electrode G3b may be arranged above the compensation semiconductor layer AO3. In other words, the compensation thin-film transistor T3 may include a double-gate electrode structure.

A second lower gate electrode G4a may be arranged below the first initialization semiconductor layer AO4, and a second upper gate electrode G4b may be arranged above the compensation semiconductor layer AO3. In other words, the first initialization thin-film transistor T4 may include a double-gate electrode.

A first interlayer insulating layer 114 may be arranged between the first lower gate electrode G3a and the compensation semiconductor layer AO3 and between the second lower gate electrode G4a and the first initialization semiconductor layer AO4. The first lower gate electrode G3a and the second lower gate electrode G4a may be formed of the same material and on the same layer as the second electrode CE2 of the storage capacitor. For example, the first lower gate electrode G3a, the second lower gate electrode G4a and the second electrode CE2 may be disposed on the second gate insulating layer 113.

A third gate insulating layer 115 may be arranged between the compensation semiconductor layer AO3 and the first upper gate electrode G3b and between the first initialization semiconductor layer AO4 and the second upper gate electrode G4b, the collective shapes of which are tapered in a thickness direction. The first upper gate electrode G3b is arranged to overlap the compensation channel area A3, and is insulated from the compensation semiconductor layer AO3 by the third gate insulating layer 115. The second upper gate electrode G4b is arranged to overlap the first initialization channel area A4, and is insulated from the first initialization semiconductor layer AO4 by the third gate insulating layer 115.

The third gate insulating layer 115 may be formed through the same mask process as the first upper gate electrode G3b and the second upper gate electrode G4b, and in this case, the third gate insulating layer 115 may be formed to have the same shape as the first upper gate electrode G3b and the second upper gate electrode G4b.

The third gate insulating layer 115 may include an inorganic material containing an oxide and/or a nitride. For example, the third gate insulating layer 115 may include silicon oxide (SiO2), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). The first upper gate electrode G3b and the second upper gate electrode G4b may be arranged on the third gate insulating layer 115, and may include molybdenum (Mo), copper (Cu), titanium (Ti), or the like, and may be formed of a single layer or multiple layers.

The boost capacitor Cbt includes a third electrode CE3 and a fourth electrode CE4. The third electrode CE3 may be arranged on the first gate insulating layer 112, which is the same layer as the driving gate electrode G1. The fourth electrode CE4 may extend from the first initialization semiconductor layer AO4 or the compensation semiconductor layer AO3. In other words, the fourth electrode CE4 may be provided as an oxide semiconductor and may be arranged on the first interlayer insulating layer 114. A second gate insulating layer 113 and a first interlayer insulating layer 114 may be arranged between the third electrode CE3 and the fourth electrode CE4, and the second gate insulating layer 113 and the first interlayer insulating layer 114 may function as dielectric layers of the boost capacitor Cbt.

The fourth electrode CE4 of the boost capacitor Cbt may be connected to the node connection line 166 through the second contact hole CNT2 to be electrically connected to the driving gate electrode G1 through the first contact hole CNT1. Accordingly, when the first scan signal Sn supplied to the first scan line SL1 is turned off, the boost capacitor Cbt may increase the voltage of the first node N1 (see FIG. 5), such that the black gradation may be clearly expressed.

The second interlayer insulating layer 116 may be arranged to cover the thin-film transistors formed of the oxide semiconductors, such as the compensation thin-film transistor T3 and the first initialization thin-film transistor T4. The second interlayer insulating layer 116 may be arranged on the first upper gate electrode G3b and the second upper gate electrode G4b, and the data line DL, the driving voltage line PL, the node connection line 166, and the connection electrodes 167, 168, and 169 may be arranged on the second interlayer insulating layer 116.

The second interlayer insulating layer 116 may include an inorganic material containing an oxide and/or a nitride. For example, the second interlayer insulating layer 116 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

The data line DL, the driving voltage line PL, the node connection line 166, and the connection electrodes 167, 168, and 169 may be formed of a material having high conductivity, such as a metal and/or a conductive oxide. For example, the data line DL, the driving voltage line PL, the node connection line 166, and the connection electrodes 167, 168, and 169 may be formed of a single layer or multiple layers including aluminum (Al), copper (Cu), titanium (Ti), or the like. In some exemplary embodiments of the present invention, the data line DL, the driving voltage line PL, the node connection line 166, and the connection electrodes 167, 168, and 169 may be formed of a triple layer structure of titanium, aluminum, and titanium (Ti/Al/Ti) that are sequentially arranged.

One end of the node connection line 166 may be connected to the driving gate electrode G1 through the first contact hole CNT1. The first contact hole CNT1 may pass through the second interlayer insulating layer 116, the first interlayer insulating layer 114, and the second gate insulating layer 113 and may expose the driving gate electrode G1. A part of the node connection line 166 may be inserted into the first contact hole CNT1 to be electrically connected to the driving gate electrode G1.

The first contact hole CNT1 may be spaced apart from an edge of the storage opening SOP in the storage opening SOP of the second electrode CE2, and thus the node connection line 166 inserted into the first contact hole CNT1 may be electrically insulated from the closed-line shape of the second electrode CE2 defining the opening SOP.

The other end of the node connection line 166 may be connected to an oxide semiconductor layer, for example, the fourth electrode CE4 of the boost capacitor Cbt or the first initialization semiconductor layer AO4 through the second contact hole CNT2. The second contact hole CNT2 may be connected to the oxide semiconductor layer through the second interlayer insulating layer 116.

In an exemplary embodiment of the present invention, the third connection electrode 169 may be connected to the initialization voltage line VIL via a contact hole through the second interlayer insulating layer 116. The third connection electrode 169 is also connected to the shielding electrode 173 through the third contact hole CNT3, and thus the initialization voltage Vint may be provided to the shielding electrode 173.

Referring to FIG. 8, the first connection electrode 167 may be connected to the light emission control semiconductor layer AS6 through the sixth contact hole CNT6. The sixth contact hole CNT6 may pass through the second interlayer insulating layer 116, the first interlayer insulating layer 114, the second gate insulating layer 113, and the first gate insulating layer 112 and may expose a part of the light emission control semiconductor layer AS6. A part of the first connection electrode 167 may be inserted into the sixth contact hole CNT6 to be electrically connected to the light emission control semiconductor layer AS6. The first connection electrode 167 may be connected to the pixel electrode 310 to transmit signals applied through the light emission control thin-film transistor T6 to the pixel electrode 310.

One end (e.g., a first end) of the second connection electrode 168 may be connected to the light emission control semiconductor layer AS6 through a fourth contact hole CNT4. The other end (e.g., a second end) of the second connection electrode 168 may be connected to the compensation semiconductor layer AO3 through a fifth contact hole CNT5.

A first planarizing layer 118 is arranged on the data line DL, the node connection line 166, the driving voltage line PL, and the connection electrodes 167, 168, and 169. The first planarizing layer 118 may include an organic material such as acryl, benzocyclobutene (BCB), polyimide, and/or hexamethyldisiloxane (HMDSO). Alternatively, the first planarizing layer 118 may include an inorganic material. The first planarization layer 118 serves as a protective layer covering the thin-film transistors T1 to T7, and an upper portion of the first planarizing layer 118 is planarized. The first planarization layer 118 may be formed of a single layer or multiple layers.

The first portion FL1 and the second portion FL2 of the connection wire, the shielding electrode 173, and the upper connection electrode 177 may be arranged on the first planarizing layer 118. The first portion FL1 may be arranged to overlap the driving voltage line PL in a thickness direction. The second portion FL2 may be arranged to overlap the initialization voltage line VIL in the thickness direction.

The shielding electrode 173 is arranged on the node connection line 166 to overlap the node connection line 166. In an exemplary embodiment of the present invention, the shielding electrode 173 may be connected to the third connection electrode 169 through the third contact hole CNT3. The third connection electrode 169 may be connected to the initialization voltage line VIL through a contact hole disposed in the second interlayer insulating layer 116. Accordingly, the initialization voltage Vint may be applied to the shielding electrode 173.

The upper connection electrode 177 may be connected to the first connection electrode 167 through a contact hole defined in the first planarizing layer 118.

The first portion FL1 and the second portion FL2 of the connection wire FL, the shielding electrode 173, and the upper connection electrode 177 may be formed of a metal and a conductive material. For example, the first portion FL1 and the second portion FL2 of the connection wire FL, the shielding electrode 173, and the upper connection electrode 177 may include aluminum (Al), copper (Cu), and/or titanium (Ti), and may be formed of a single layer or multiple layers.

The second planarizing layer 119 may be arranged to cover the first portion FL1, the second portion FL2, the shielding electrode 173, and the upper connection electrode 177. The second planarizing layer 119 may include an organic material such as acryl, benzocyclobutene (BCB), polyimide, and/or hexamethyldisiloxane (HDSO). Alternatively, the first planarizing layer 118 may include an inorganic material. An upper portion of the second planarizing layer 119 may be planarized, and the second planarizing layer 119 may be formed of a single layer or multiple layers.

The organic light-emitting diode OLED including a pixel electrode 310, an opposite electrode 330, and an intermediate layer 320 that is interposed therebetween and includes a light-emitting layer may be positioned on the second planarizing layer 119.

The pixel electrode 310 may be connected to the upper connection electrode 177 through a contact hole defined in the second planarizing layer 119, and may be connected to the light emission control drain area D6 of the light emission control thin-film transistor T6 by the upper connection electrode 177 and the first connection electrode 167.

In an exemplary embodiment of the present invention, the pixel electrode 310 may overlap the first portion FL1 or the second portion FL2 of the connection wire.

A pixel-defining layer 120 may be arranged on the second planarizing layer 119. The pixel-defining layer 120 defines a pixel by having an opening corresponding to each sub-pixel, for example, an opening exposing at least a central portion of the pixel electrode 310. In addition, the pixel-defining layer 120 may increase a distance between the edge of the pixel electrode 310 and the opposite electrode 330 above the pixel electrode 310, and thus prevents an arc from occurring at the edge of the pixel electrode 310. The pixel-defining layer 120 may be formed of an organic material such as polyimide and/or hexamethyldisiloxane (HMDSO).

The intermediate layer 320 of the organic light-emitting diode OLED may include a low molecular material or a high molecular material. When the low molecular material is included, the intermediate layer 320 may have a structure in which a hole injection layer (HIL), a hole transport layer (HTL), an emission layer (EML), an electron transport layer (ETL), an electron injection layer (EIL), etc. are stacked in a single or composite structure, and may include various organic materials such as copper phthalocyanine (CuPc), N, N-di(naphthalene-1-yl)-N, N'-diphenyl-benzidine (NPB), and/or tris-8-hydroxyquinoline aluminum (Alq3). These layers may be formed by means of vacuum deposition.

When the intermediate layer 320 includes a high molecular material, the intermediate layer 320 may generally have a structure including an HTL and an EML. In this case, the may include poly(3,4-ethylenedioxythiophene) (PEDOT), and the EML may include a high molecular material, such as a poly-phenylenevinylene (PPV)-based material and/or a polyfluorene-based material. The intermediate layer 320 may be formed by means of screen printing, inkjet printing, laser induced thermal imaging (LITI), etc.

However, the intermediate layer 320 is not necessarily limited thereto, and may also have various structures. Also, the intermediate layer 320 may include a layer integrated over a plurality of pixel electrodes 310, or may include a layer patterned to correspond to each of the plurality of pixel electrodes 310.

The opposite electrode 330 may be integrally formed with a plurality of organic light-emitting diodes to correspond to the plurality of pixel electrodes 310.

Because the organic light-emitting diode OLED may be easily damaged by moisture or oxygen introduced from the outside, a thin-film encapsulation layer or a sealing substrate may be arranged on the organic light-emitting diode OLED to cover and protect the same. The thin-film encapsulation layer) may cover the display area DA and extend to the outside of the display area DA. The thin-film encapsulation layer may include an inorganic encapsulation layer including at least one inorganic material and an organic encapsulation layer including at least one organic material. In some exemplary embodiments of the present invention, the thin-film encapsulation layer may have a structure in which a first inorganic encapsulation layer, an organic encapsulation layer, and a second inorganic encapsulation layer are stacked. The sealing substrate may be arranged to face the substrate 110, and may be bonded to the substrate 110 in the non-display area NDA (see FIG. 1) by using a sealing member such as a sealant and/or frit.

Also, a spacer for preventing a mask from being stamped may be further arranged on the pixel-defining layer 120. A variety of functional layers, such as a polarization layer for reducing external light reflection, a black matrix, a color filter, and/or a touch screen layer having a touch electrode, may be provided on a thin-film encapsulation layer.

In the display apparatus according to an exemplary embodiment of the present invention, a plurality of pixel circuits having the same shape as described with reference to FIG. 6 may be arranged along the first direction (e.g., the DR1 direction) and the second direction (e.g., the DR2 direction). In another exemplary embodiment of the present invention, the pixel circuits included in the display apparatus may be arranged in a symmetrical shape with a pixel circuit adjacent thereto. When the pixel circuits included in the display apparatus have a symmetrical shape with each other, vertical crosstalk between a data line of the first pixel circuit and a scan line of a second pixel circuit adjacent to the first pixel circuit may be prevented.

Figure 9:
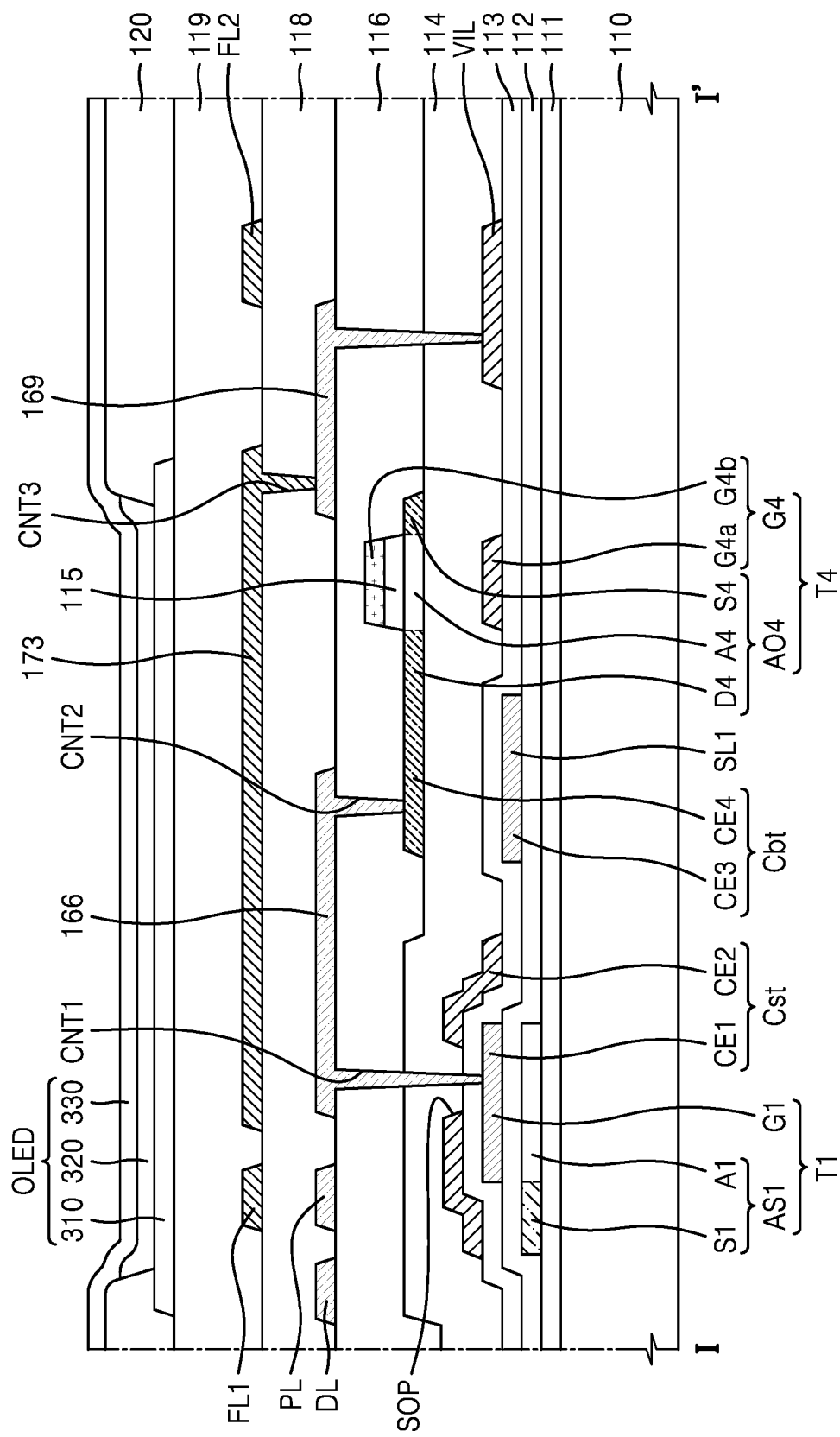
FIG. 9 is a schematic cross-sectional view of one pixel circuit taken along the line I-I' of FIG. 6 according to an exemplary embodiment of the present invention.

FIG. 9 is a cross-sectional view of one pixel circuit of the display apparatus according to an exemplary embodiment of the present invention. In FIG. 9, the same reference numerals as those in FIG. 7 may refer to the same members, and thus, redundant description thereof will be omitted.

Referring to FIG. 9, the display apparatus according to an exemplary embodiment of the present invention includes the substrate 110, the first thin-film transistor (e.g., the driving thin-film transistor T1) including the silicon semiconductor (e.g., the driving semiconductor layer AS1), the second thin-film transistor (e.g., the first initialization thin-film transistor T4) including the oxide semiconductor (e.g., the first initialization semiconductor layer AO4), the driving voltage line PL extending in the first direction (e.g., the DR1 direction) in the display area, the data line DL spaced apart from the driving voltage line PL, and the connection wire FL connecting the data line DL to the pad portion PADA. Herein, the connection wire FL may include the first portion FL1 extending in the first direction (e.g., the DR1 direction) and the second portion FL2 extending in the second direction (e.g., the DR2 direction), and the first portion FL1 may overlap the driving voltage line PL.

According to the present exemplary embodiment of the present invention, the initialization voltage line VIL may be arranged on the second gate insulating layer 113. For example, the initialization voltage line VIL may be arranged between the second gate insulating layer 113 and the first interlayer insulating layer 114. For example, the second lower gate electrode G4a and the second electrode CE2 of the storage capacitor Cst may be arranged on the same layer. Additionally, the contact hole connecting the initialization voltage line VIL with the third connection electrode 169 may penetrate the first interlayer insulating layer 114 and the second interlayer insulating layer 116.

In an exemplary embodiment of the present invention, the third electrode CE3 of the boost capacitor Cbt may be provided as a part of the first scan line SL1 and may be connected to the switching gate electrode. Accordingly, the third electrode CE3 of the boost capacitor Cbt may be integrated with the first scan line SL1. In this case, the first scan line SL1 may not overlap the initialization voltage line VIL in the thickness direction.

Figure 10:
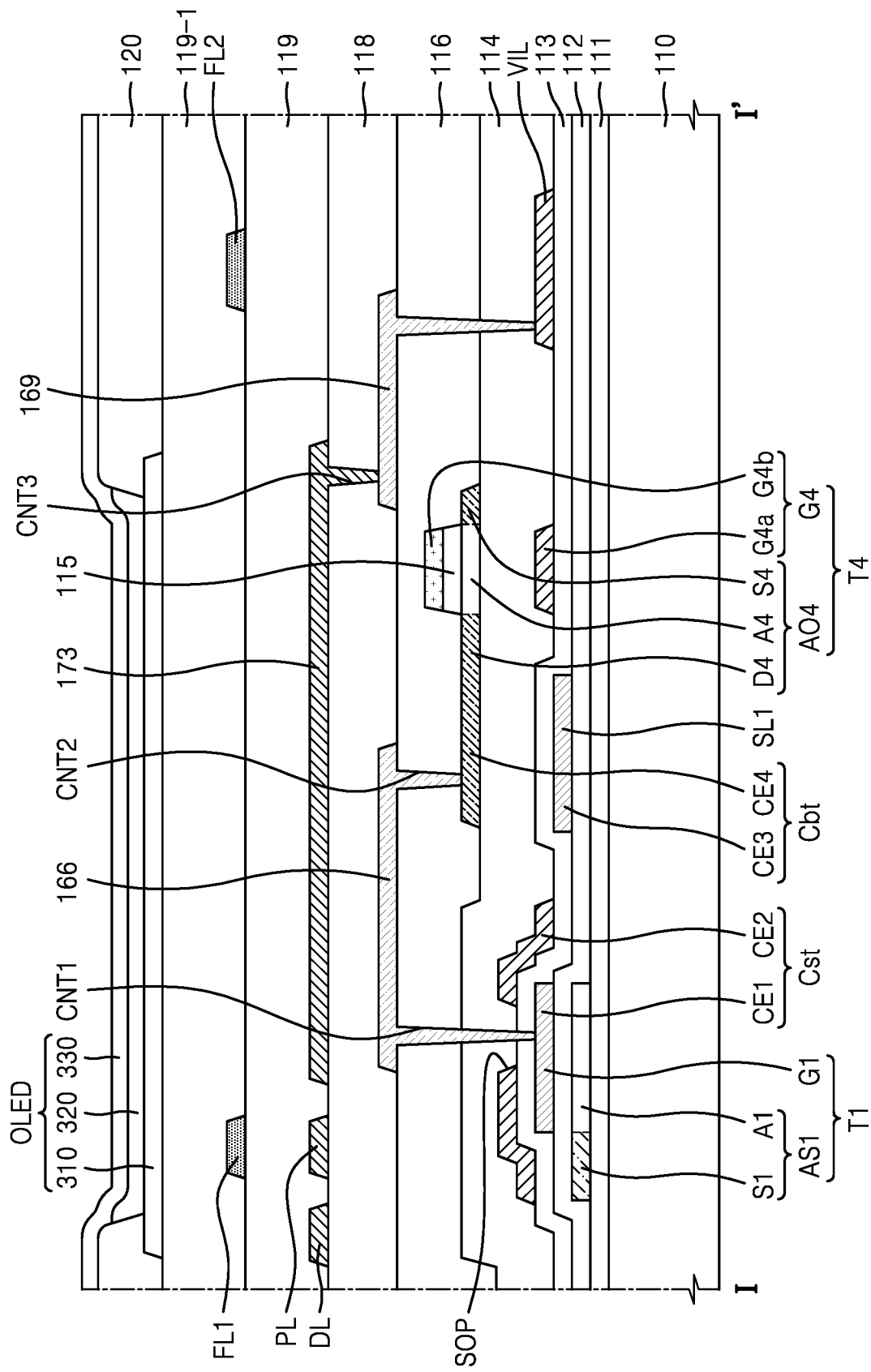
FIG. 10 is a schematic cross-sectional view of one pixel circuit taken along line I-I' of FIG. 6 according to an exemplary embodiment of the present invention.

FIG. 10 is a cross-sectional view of one pixel circuit of the display apparatus according to an exemplary embodiment of the present invention. In FIG. 10, the same reference numerals as those described with reference to FIG. 9 may refer to the same members, and thus, redundant description thereof will be omitted.

Referring to FIG. 10, the display apparatus according to an exemplary embodiment of the present invention includes the substrate 110, the first thin-film transistor including the silicon semiconductor, the second thin-film transistor including the oxide semiconductor, the driving voltage line PL extending in the first direction (e.g., the DR1 direction) in the display area, the data line DL spaced apart from the driving voltage line PL, and the connection wire FL connecting the data line DL to the pad portion PADA. Herein, the connection wire FL may include the first portion FL1 extending in the first direction (e.g., the DR1 direction) and the second portion FL2 extending in the second direction (e.g., the DR2 direction), and the first portion FL1 may overlap the driving voltage line PL.

In an exemplary embodiment of the present invention, the data line DL and the driving voltage line PL may be arranged on the first planarizing layer 118. Accordingly, the data line DL and the driving voltage litre PL may be arranged on the same layer as the shielding electrode 173. The second planarizing layer 119 may be arranged to cover the data line DL, the driving voltage line PL, and the shielding electrode 173.

In an exemplary embodiment of the present invention, the first portion FL1 and/or the second portion FL2 of the connection wire FL may be arranged on the second planarizing layer 119.

In an exemplary embodiment of the present invention, a third planarizing layer 119-1 may be arranged to cover the first portion FL1 and/or the second portion FL2 of the connection wire. The third planarizing layer 119-1 may include an organic material such as acryl, benzocyclobutene (BCB), polyimide and/or hexamethyldisiloxane (HMDSO). Alternatively, the third planarizing layer 119-1 may include an inorganic material. An upper portion of the third planarizing layer 119-1 is planarized. The third planarizing layer 119-1 may be formed of a single layer or multiple layers.

The display element including the pixel electrode 310 may be arranged on the third planarizing layer 119-1.

Figure 11A:
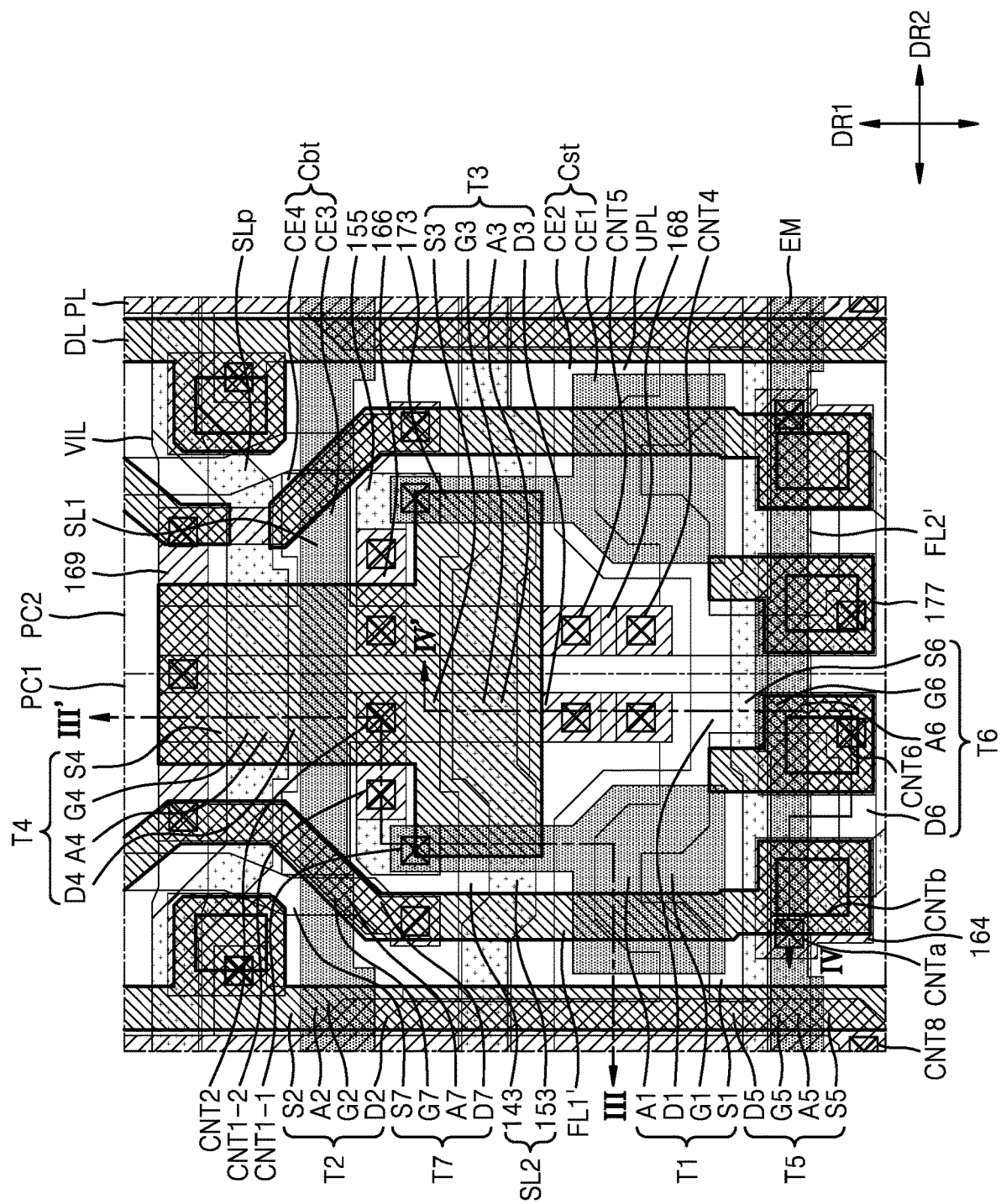
FIG. 11A is a schematic layout view of positions of a plurality of thin-film transistors and capacitors arranged in a first pixel circuit and a second pixel circuit of a display apparatus according to an exemplary embodiment of the present invention.
Figure 11B:
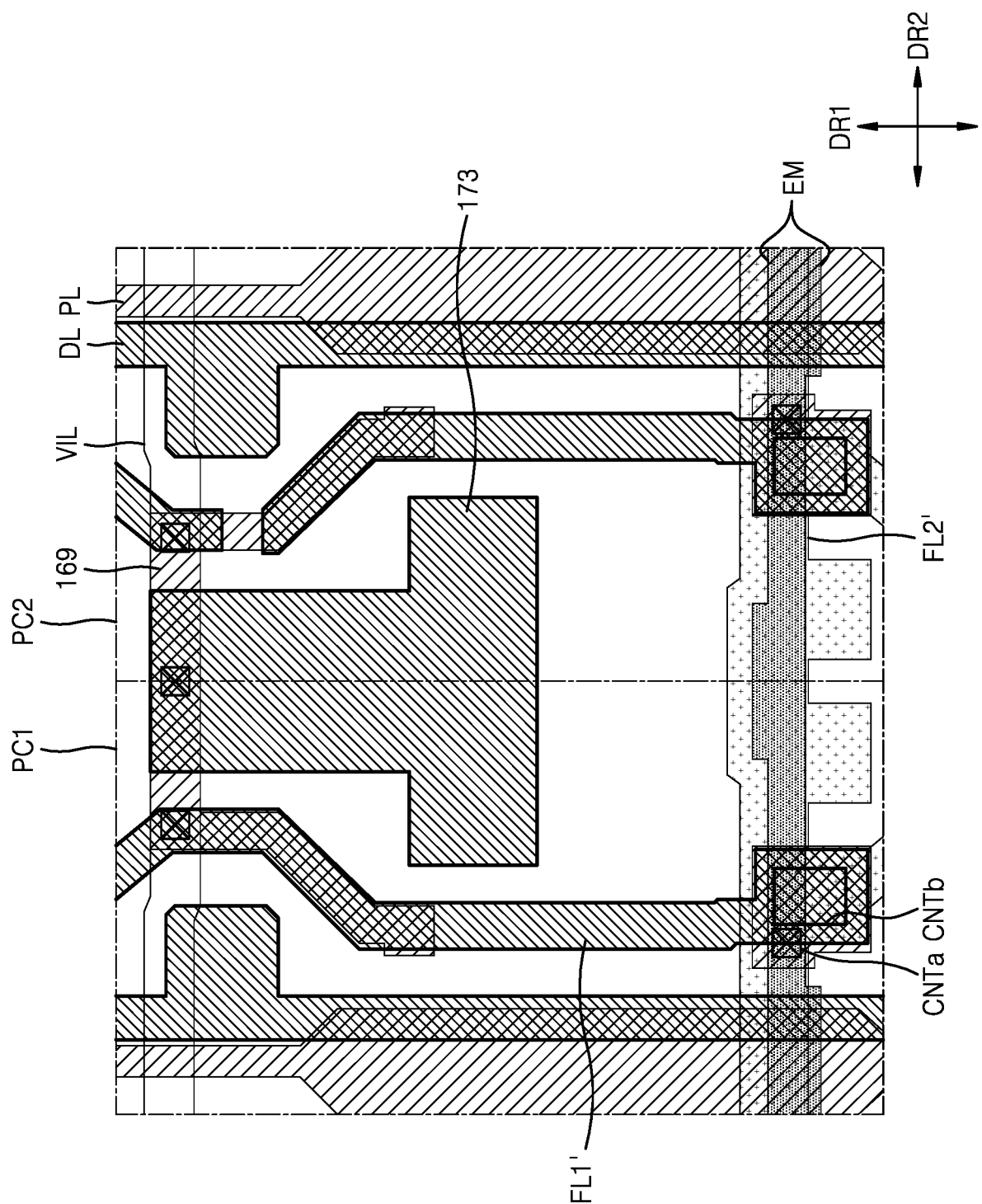
FIG. 11B is a layout view of some of wires of a display apparatus according to an exemplary embodiment of the present invention.
Figure 12:
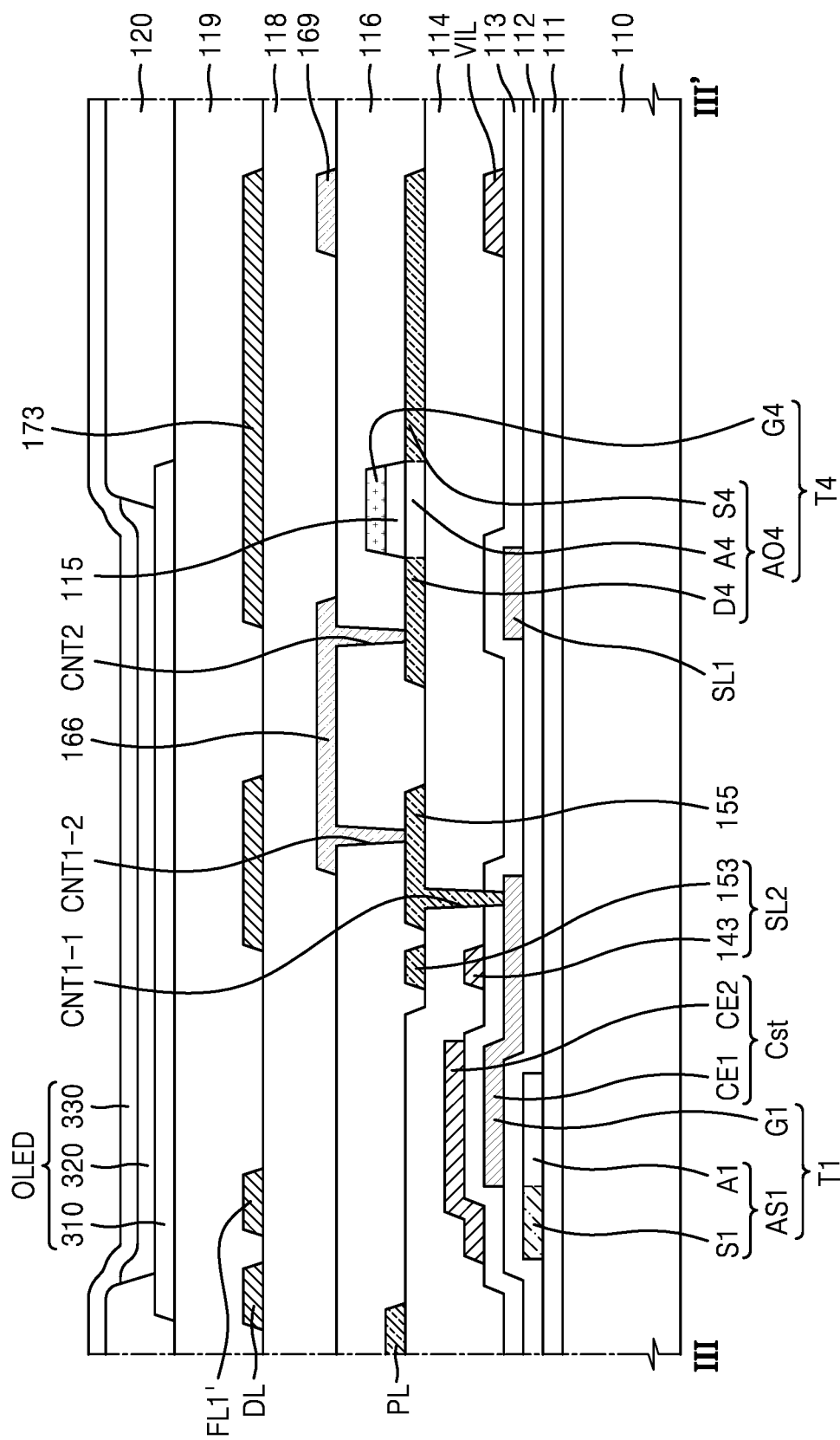
FIG. 12 is a schematic cross-sectional view taken along a line III-III' of FIG. 11A according to an exemplary embodiment of the present invention.
Figure 13:
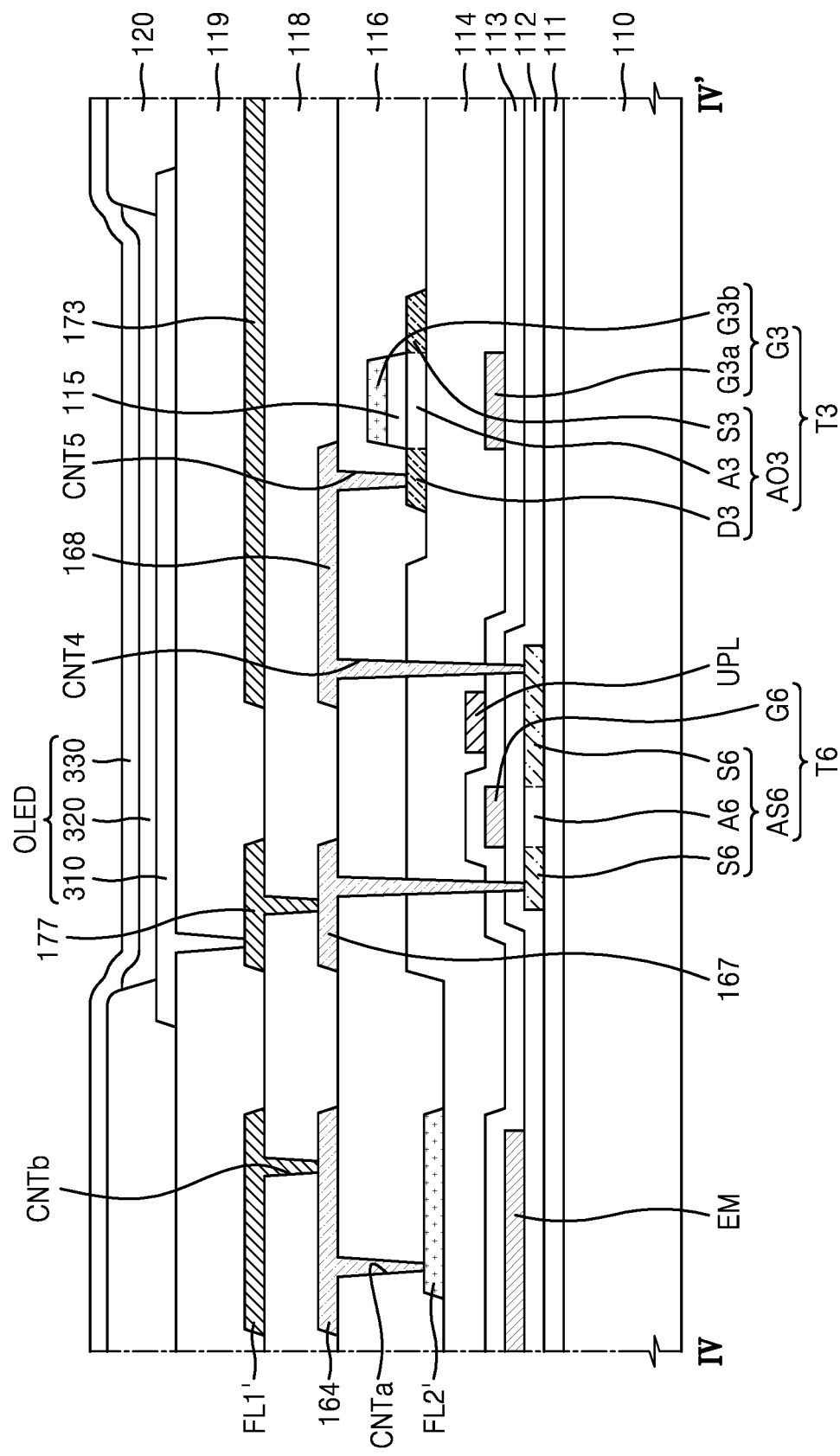
FIG. 13 is a schematic cross-sectional view taken along a line IV-IV' of FIG. 11A according to an exemplary embodiment of the present invention.

FIG. 11A is a schematic layout view of positions of a plurality of thin-film transistors and capacitors arranged in a first pixel circuit and a second pixel circuit of the display apparatus according to an exemplary embodiment of the present invention. FIG. 11B is a layout view of a part of wires of the display apparatus according to an exemplary embodiment of the present invention, FIG. 12 is a schematic cross-sectional view taken along line III-III' of FIG. 11A, and FIG. 13 is a schematic cross-sectional view taken along line IV-IV" of FIG. 11A.

In FIGS. 11A, 11B, 12 and 13, the same reference numerals as those described in reference to FIGS. 6, 7 and 8 may refer to the same members, and thus, redundant description thereof will be omitted.

Referring to FIG. 11A, the display apparatus according to an exemplary embodiment of the present invention may include a first pixel circuit PC1 and a second pixel circuit PC2. In this case, the first pixel circuit PC1 and the second pixel circuit PC2 may be symmetrically arranged about an axis of the first direction (e.g., the DR1 direction). Accordingly, vertical crosstalk between a data line DL of the first pixel circuit PC1 and a scan line of the second pixel circuit PC2 adjacent to the first pixel circuit PC1 may be prevented. The first pixel circuit PC1 and the second pixel circuit PC2 are symmetrically arranged, and thus, the first pixel circuit PC1 will be mainly described, and description of the second pixel circuit PC2 will be omitted.

The first pixel circuit PC1 of the display apparatus according to an exemplary embodiment of the present invention includes a data line DL and a driving voltage line PL extending along a first direction (e.g., the DR1 direction), and includes a first scan line SL1, a second scan line SL2, a previous scan line SLp, a next scan line, a light emission control line EM, and an initialization voltage line VIL extending along a second direction (e.g., the DR2 direction) crossing the first direction (e.g., the DR1 direction). Also, a connection wire FL for connecting the data line DL to the pad portion may be provided in the display area.

The first pixel circuit PC1 may include a driving thin-film transistor T1, a switching thin-film transistor T2, a compensation thin-film transistor T3, a first initialization thin-film transistor T4, an operation control thin-film transistor T5, a light emission control thin-film transistor T6, a second initialization thin-film transistor T7, a storage capacitor Cst, and a boost capacitor Cbt.

In an exemplary embodiment of the present invention, the driving thin-film transistor T1, the switching thin-film transistor T2, the operation control thin-film transistor T5, the light emission control thin-film transistor T6, and the second initialization thin-film transistor T7 may be provided as thin-film transistors including a silicon semiconductor.

Also, the compensation thin-film transistor T3 and the first initialization thin-film transistor T4 may be provided as thin-film transistors including an oxide semiconductor.

Semiconductor layers of the driving thin-film transistor T1, the switching thin-film transistor T2, the operation control thin-film transistor T5, the light emission control thin-film transistor T6, and the second initialization thin-film transistor T7 are arranged on the same layer and include the same material. For example, the semiconductor layer may be formed of polycrystalline silicon.

Referring to FIGS. 11A and 12, the first electrode CE1 of the storage capacitor Cst may extend in the first direction (e.g., the DR1 direction). In this case, the second electrode CE2 may not include a storage opening. The first electrode CE1 may be connected to a first intermediate connection electrode 155 through a first connection contact hole CNT1-1.

The first intermediate connection electrode 155 may be connected to the first electrode CE1 through the first connection contact hole CNT1-1, and may be connected to the node connection line 166 through a second connection contact hole CNT1-2. The compensation source area S3 may be connected to the driving gate electrode G1 through the first intermediate connection electrode 155 and the node connection line 166. Also, the node connection line 166 may be connected to the first initialization drain area D4 through the second contact hole CNT2.

In an exemplary embodiment of the present invention, the initialization voltage line VIL and the previous scan line SLp may overlap each other. In this case, the initialization voltage line VIL may be arranged on the same layer as the lower scan line 143 of the second scan line SL2. The initialization voltage line VIL may be spaced apart from the first scan line SL1.

Referring to FIGS. 11A and 11B, the connection wire may include a first wire FL1' extending in the first direction (e.g., the DR1 direction) and a second wire FL2' extending in the second direction (e.g., the DR2 direction). The first wire FL1' and the second wire FL2' may include protrusions.

In an exemplary embodiment of the present invention, the first wire FL1' may overlap the third connection electrode 169. In this case, the first wire FL1' may be continuously arranged in an extension direction of the third connection electrode 169. In an exemplary embodiment of the present invention, the first wire FL1' may overlap the driving voltage line PL. Also, the first wire FL1' may overlap the pixel electrode 310.

The second wire FL2' may extend in the second direction (e.g., the DR2 direction). For example, the second wire FL2' may be arranged continuously overlapping the light emission control line EM.

In the present exemplary embodiment of the present invention, the first wire FL1' and the second wire FL2' may be arranged on different layers. For example, the first wire FL'1 may be arranged on the same layer as the shielding electrode 173, and the second wire FL2' may be arranged on the same layer as the upper scan line 153 of the second scan line SL2. For example, the second wire FL2' may be arranged between the first interlayer insulating layer 114 and the second interlayer insulating layer 116.

Referring to FIGS. 11A, 11B, and 13, the first wire FL1' and the second wire FL2' may be connected through contact holes in the display area. For example, the first wire FL1' may be connected to a second intermediate connection electrode 164 through a second intermediate contact hole CNTb. The second intermediate connection electrode 164 may be connected to the second wire FL2' through a first intermediate contact hole CNTa. Accordingly, the data signals may be transmitted from the second wire FL2' to the first wire FL1'. In the present exemplary embodiment of the present invention, the second wire FL2' of the connection wire may be arranged on the same layer as the upper scan line 153 to overlap the light emission control line EM, such that a space may be utilized. Also, crosstalk with the scan lines may be prevented.

According to the exemplary embodiment of the present invention as described above, provided is a display apparatus in which a driving circuit for driving a display element includes a first thin-film transistor formed of a silicon semiconductor and a second thin-film transistor formed of an oxide semiconductor, thereby reducing power consumption, and wires arranged in a non-display area are caused to bypass into a display area, thereby reducing the area of the non-display area.

While exemplary embodiments of the present invention have been shown and described above, it will be understood by those of ordinary skill in the art that various changes in form and details may be made therein without departing from the spirit and scope of the present invention as defined by the following claims.

What is claimed is:

1. A display apparatus, comprising:
a substrate comprising a display area and a non-display area, wherein the non-display area includes a pad portion outside the display area;
a first thin-film transistor arranged in the display area, and comprising a first semiconductor layer including a silicon semiconductor and a first gate electrode insulated from the first semiconductor layer;
a first insulating layer covering the first gate electrode;
a second thin-film transistor arranged on the first insulating layer, and comprising a second semiconductor layer including an oxide semiconductor and a second gate electrode insulated from the second semiconductor layer;
a second insulating layer covering the second gate electrode;
a first voltage line extending in a first direction and arranged on the second insulating layer;
a first wire extending in the first direction adjacent to the first voltage line;
a first signal line extending in a second direction crossing the first wire, wherein the first signal line is arranged on the same layer as the first gate electrode; and
a second wire overlapping the first signal line and extending in the second direction,
wherein the first wire is connected to the second wire through a contact hole in the display area.

2. The display apparatus of claim 1,
wherein the second wire is arranged between the first insulating layer and the second insulating layer.

3. The display apparatus of claim 2, further comprising:
a first connection electrode arranged on the first insulating layer; and
a second connection electrode connected to the first connection electrode through a first contact hole and arranged on the second insulating layer,
wherein the first gate electrode is connected to the first connection electrode through a second contact hole, and
the second connection electrode is connected to the second semiconductor layer through a third contact hole.

4. The display apparatus of claim 1, further comprising a data line extending in the first direction,
wherein the data line is connected to the pad portion through the first wire and the second wire.

* * * * *